(12) United States Patent
Smith

(10) Patent No.: US 7,442,951 B2
(45) Date of Patent: Oct. 28, 2008

(54) RETICLE FOR USE IN RAPID DETERMINATION OF AVERAGE INTRAFIELD SCANNING DISTORTION HAVING TRANSMISSIVITY OF A COMPLEMENTARY ALIGNMENT ATTRIBUTE BEING DIFFERENT THAN THE TRANSMISSIVITY OF AT LEAST ONE ALIGNMENT ATTRIBUTE

(75) Inventor: Adlai Smith, Escondido, CA (US)

(73) Assignee: Litel Instruments, San Diego, CA (US)

( * ) Notice: Subject to any disclaimer, the term of this patent is extended or adjusted under 35 U.S.C. 154(b) by 0 days.

(21) Appl. No.: 11/696,348

(22) Filed: Apr. 4, 2007

(65) Prior Publication Data

US 2007/0177132 A1     Aug. 2, 2007

Related U.S. Application Data

(63) Continuation of application No. 11/102,382, filed on Apr. 8, 2005, now Pat. No. 7,262,398, which is a continuation-in-part of application No. 10/252,021, filed on Sep. 20, 2002, now Pat. No. 6,906,303.

(60) Provisional application No. 60/323,577, filed on Sep. 20, 2001.

(51) Int. Cl.
    *G01N 21/86*     (2006.01)
(52) U.S. Cl. .................. 250/559.4; 250/559.3
(58) Field of Classification Search ............. 250/208.1, 250/559.3, 548, 221, 559.4; 356/399–402; 355/51, 53
See application file for complete search history.

(56) References Cited

U.S. PATENT DOCUMENTS 4,153,371 A * 5/1979 Koizumi et al. ............. 356/400
4,741,622 A * 5/1988 Suwa et al. ................. 356/401

(Continued)

OTHER PUBLICATIONS

Bjorkholm et al., "Reduction Imaging at 14 nm Using Multilayer-Coated Optics: Printing of Features Smaller than 0.1 μm", J. Vac. Sci. Technol. B., 8(6):1509-1543 (1990).

(Continued)

*Primary Examiner*—Que T Le

(57) ABSTRACT

A method and apparatus for determining lens distortion in a projection imaging tool are described. The techniques include exposing at least one alignment attribute onto a substrate having a recording media. A complementary alignment attribute is also exposed onto the substrate such that the complementary alignment attribute and alignment attribute form a completed alignment attribute. The exposure of the alignment attributes, or the complementary alignment attribute, or both, may be accomplished by multiple sub nominal dose exposures. Intra field distortion of the projection imaging tool is determined from measurements of the exposed completed alignment attributes. The alignment attributes and complimentary alignment attribute may be part of a reticle. The transmission of the alignment attribute may be different than the transmission of the complementary alignment attribute.

8 Claims, 30 Drawing Sheets

U.S. PATENT DOCUMENTS

| | | | |
|---|---|---|---|
| 4,861,148 | A | 8/1989 | Sato et al. |
| 5,285,236 | A | 2/1994 | Jain |
| 5,402,224 | A | 3/1995 | Hirukawa et al. |
| 5,438,413 | A | 8/1995 | Mazor et al. |
| 5,615,006 | A | 3/1997 | Hirukawa et al. |
| 5,757,507 | A | 5/1998 | Ausschnitt et al. |
| 5,767,523 | A * | 6/1998 | McCullough ............... 250/548 |
| 5,877,861 | A | 3/1999 | Ausschnitt et al. |
| 5,894,350 | A | 4/1999 | Hsieh et al. |
| 6,079,256 | A | 6/2000 | Bareket |
| 6,093,931 | A | 7/2000 | Sugihara et al. |
| 6,143,621 | A | 11/2000 | Tzeng et al. |
| 6,153,886 | A | 11/2000 | Hagiwara et al. |
| 6,204,912 | B1 | 3/2001 | Tsuchiya et al. |
| 6,259,525 | B1 | 7/2001 | David |
| 6,573,986 | B2 | 6/2003 | Smith et al. |
| 6,734,971 | B2 * | 5/2004 | Smith et al. ................. 356/401 |
| 6,906,780 | B1 | 6/2005 | Smith |
| 7,271,905 | B2 * | 9/2007 | Smith et al. ................. 356/401 |

OTHER PUBLICATIONS

Bruning et al., "Optical Lithography—Thirty Years and Three Orders of Magnitude", Proc. of SPIE, 3051:14-27 (1997).

Cote et al., "MicrascanTM III-Performance of a Third Generation, Catadioptric Step and Scan Lithographic Tool", Proc. of SPIE, 3051:806-816 (1997).

DeJule, R., "Mix and Match: A Necessary Choice", Semiconductor International, 23(2):66-76 (2000).

de Zwart et al., "Performance of a Step and Scan System for DUV Lithography", Proc. of SPIE, 3051:817-835 (1997).

Dooly et al., "Stepper Matching for Optimum Line Performance", Proc. of SPIE, 3051:426-432 (1997).

Goodwin et al., "Characterizing Overlay Registration of Concentric 5X and 1X Stepper Exposure Fields Using Interfield Data", Proc. of SPIE, 3050:407-417 (1997).

Rai-Choudhury, P., Handbook of Microlithography, Micromachining and Microfabrication, Book: vol. 1, "Microlithography", no date.

SPIE Optical Engineering Press, Proc. of SPIE, Bellingham, Washington, pp. 417-418 (1997).

Kemp et al., "A 'Golden Standard' Wafer Design for Optical Stepper Characterization", Proc. of SPIE, 1464:260-266 (1991).

Hasan et al., "Automated Electrical Measurements of Registration Errors in Step-and-Repeat Optical Lithography Systems", no date.

IEEE Transactions on Electron Devices, ED27(12):2304-2312 (1980).

KLA 5000 Series Applicate Note, "Overlay Target Design",KLA Instruments Corporation, 4 pages, (1996).

KLA 5105, "Linewidth and Misregistration System", KLA 5105 Product Specification, KLA Instruments Corporation, 2 pages (1995).

KLA 5200, "Value-added Overlay Metrology for Advanced Lithography", KLA 5200 Product Specifications, KLS Instruments Corporation, 2 pages, (1996).

Kodama et al., "Measuring System XY-5i", Proc. of SPIE, 2439:144-155 (1995).

Leica LMS IPRO, "Fully Automated Mask and Wafer Metrology System", Leica, pamphlet pp. 1-5, no date.

MacMillen et al., "Analysis of Image Field Placement Deviations of a 5X Microlithographic Reduction Lens", Proc. of SPIE, 334:78-89 (1982).

Martin et al., "Measuring Fab Overlay Programs", Proc. of SPIE, 3677:64-71 (1999).

McFadden et al., "A Computer Aided Engineering Workstation for Registration Control", Proc. of SPIE, 1087:255-266 (1989).

Mulkens et al., "ArF Step and Scan Exposure System for 0.15 µm Technology Node?", Proc. of SPIE, 3679:506-521 (1999).

Newman et al., "Development of XUV Projection Lithograph at 60-80 nm", Proc. of SPIE, 1671:419-436 (1992).

Press et al., Numerical Recipes, "The Art of Scientific Computing", Cambridge University Press, New York, pp. 52-64 (1990).

Pellegrini, J.C., "Comparisons of Six Different Intrafield Control Paradigms in an Advanced Mix-and-Match Environment", Proc. of SPIE, 3050:398-406 (1997).

Pellegrini et al., "Super Sparse Overlay Sampling Plans: An Evaluation of Methods and Algorithms for Optimizing Overlay Quality Control and Metrology Tool Throughput", no date Proc. of SPIE, 3677:72-82 (1999).

Preil et al., "A New Approach to Correlating Overlay and Yield", Proc. of SPIE, 3677:208-216 (1999).

Quaestor Q7, "Fully Automated Optical Metrology System for Advanced IC Production", Quaestor Q7 Product Specification, BIO-RAD, 2 pages, no date.

Raugh, M.R., "Error Estimation for Lattice Methods of State Self-Calibration", Proc. of SPIE, 3050:614-625 (1997).

Sullivan, N.T., "Semiconductor Pattern Overlay", Proc. of SPIE Critical Reviews of Optical Science and Technology, CR52:160-188 (1994).

Takac et al., "Self-Calibration in Two-Dimensions: The Experiment", Proc. of SPIE, 2725:130-146 (1996).

van den Brink et al., "Direct-Referencing Automatic Two-Points Reticle-to-Wafer Alignment Using a Projection Column Servo System", Proc. of SPIE, 633:60-71 (1986).

van den Brink et al., "Matching Management of Multiple Wafer Steppers Using a Stable Standard and a Matching Simulator", Proc. of SPIE, 1087:218-232 (1989).

van den Brink et al., "Matching of Multiple Wafer Steppers for 0.35 µm Lithography Using Advanced Optimization Schemes", Proc. of SPIE, 1926:188-207 (1993).

van den Brink et al., "Matching Performance for Multiple Wafer Steppers Using an Advanced Metrology Procedure", Proc. of SPIE, 921:180-197 (1988).

van Schoot et al., "0.7 NA DUV Step & Scan System for 150nm Imaging with Improved Overlay", Proc. of SPIE, 3679:448-463 (1999).

Yost et al., "Lens Matching and Distortion Testing in a Multi-Stepper, Sub-Micron Environment", Proc. of SPIE, 1087:233-244 (1989).

Zavecz et al., "Life Beyond Mix-and-Match: Controlling Sub-0.18 µm Overlay Errors", Semiconductor International, 23(8):205,206,208,210,212 and 214 (2000).

Zavecz, T.E., "Machine Models and Registration", Proc. of SPIE Critical Reviews of Optical Science and Technology, CR52:134-159 (1994).

Armitage Jr., J.D. and Kirk, J.P., "Analysis of overlay distortion patterns", Proc. of SPIE, 921:207-222, (1988).

Lin, B.J., "The Attenuated Phase-Shifting Mask", Solid State Technology, Special Series/Advanced Lithography, 35(1):43-47, (Jan. 1992).

* cited by examiner

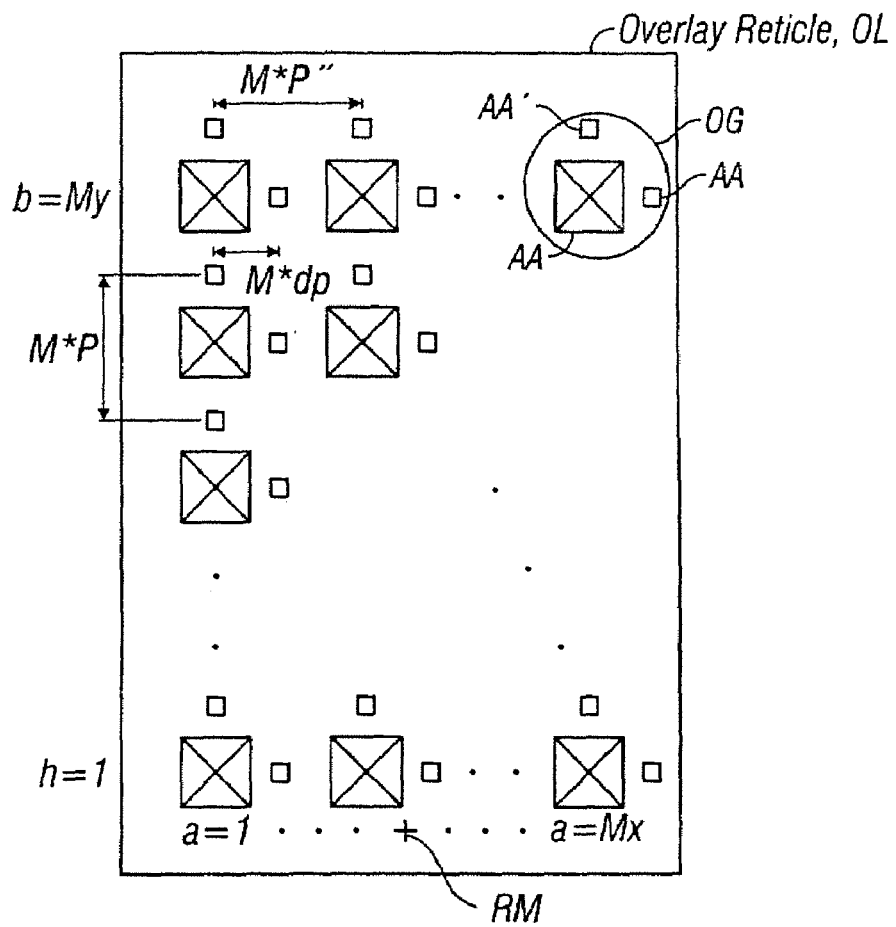
FIG. 6
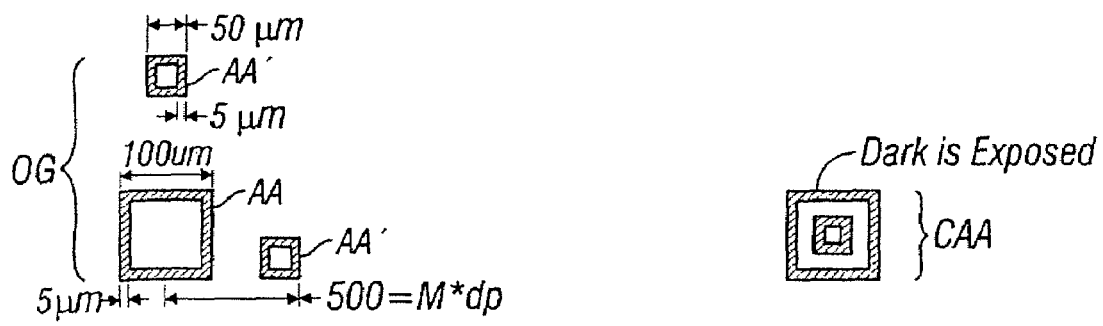
FIG. 7
FIG. 8

```
Machine id: DUVF11-02 yfn        Δxs(yfn)    Δys(yfn)    dys/dx (yfn)
-15000.000    -0.139      0.044       .324
 -8000.000     0.223     -0.223       .34
 -6000.000     0.498      0.004      1.30
     ⋮           ⋮          ⋮          ⋮
 15000.000     0.099     -0.188      3.39
```

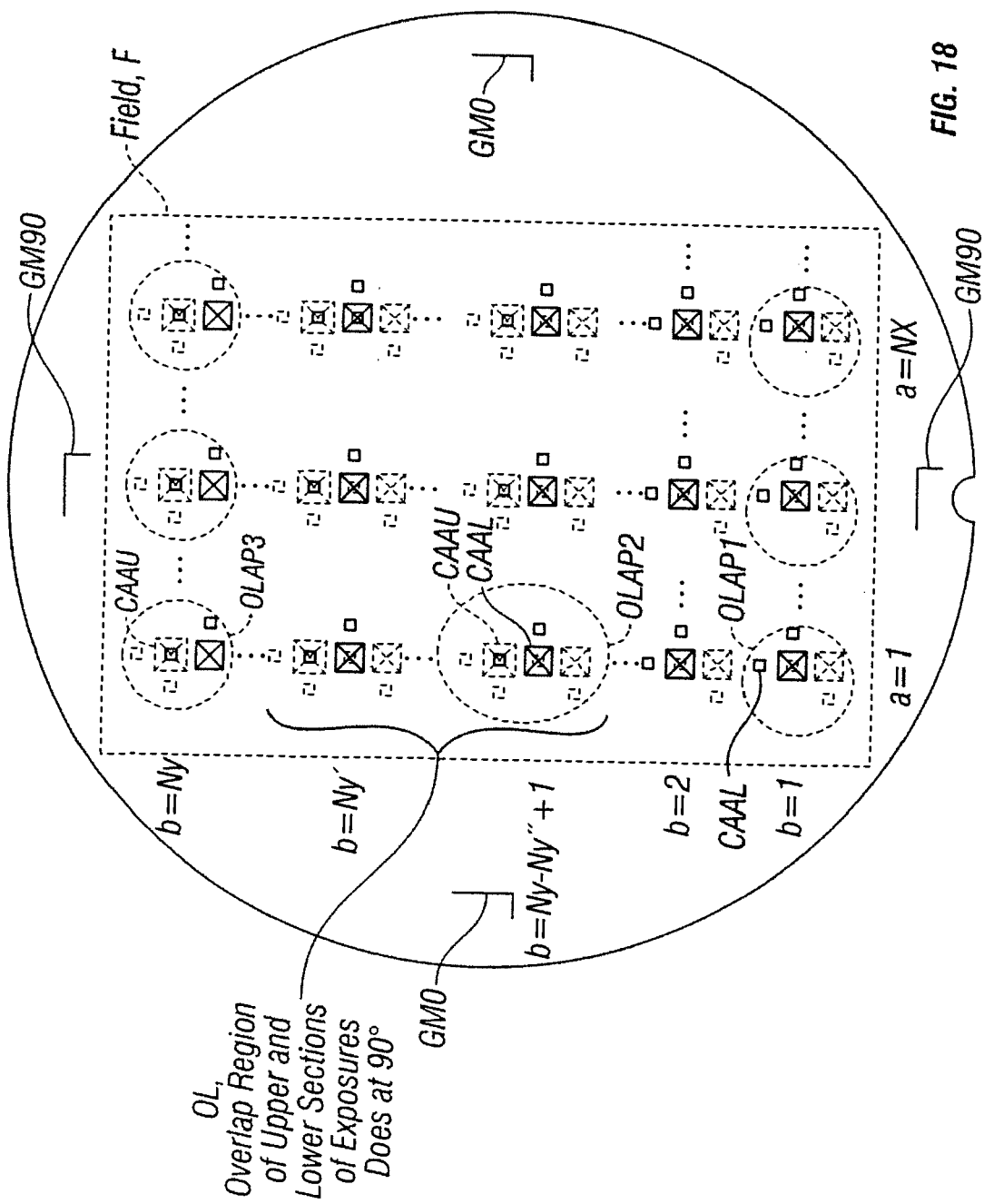

□
⊠ □  Overlay Group After First Exposure, Water at 0°
□

□
⌐ ⊠ ¬  Overlay Group After Exposures Done at 90°, Lower Portion (R1)
□

□
⌐ □ ¬  Overlay Group After Exposures Done at 90°, Upper Portion (R1)

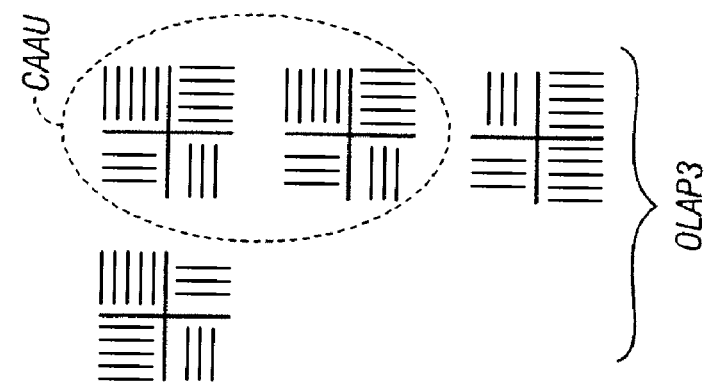
FIG. 23
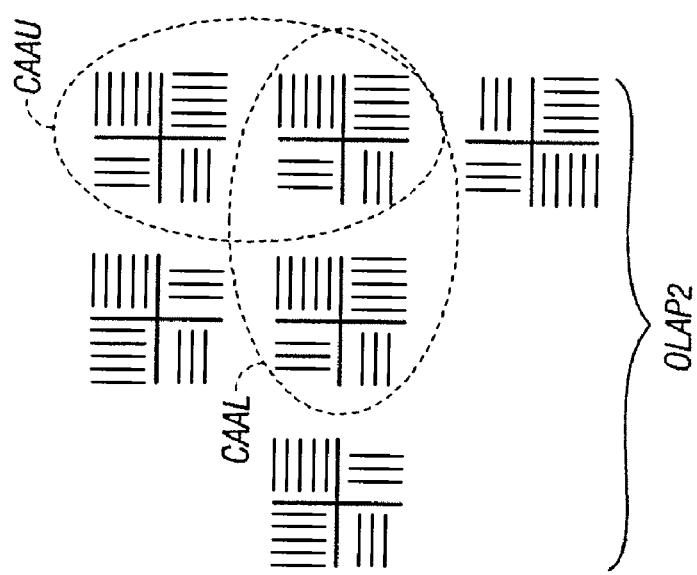
FIG. 24
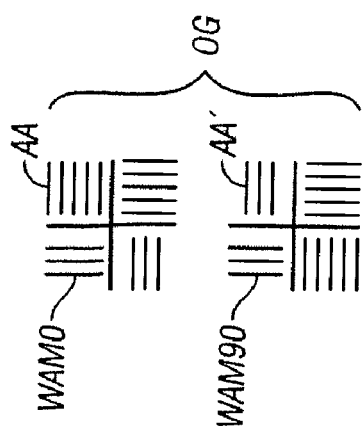
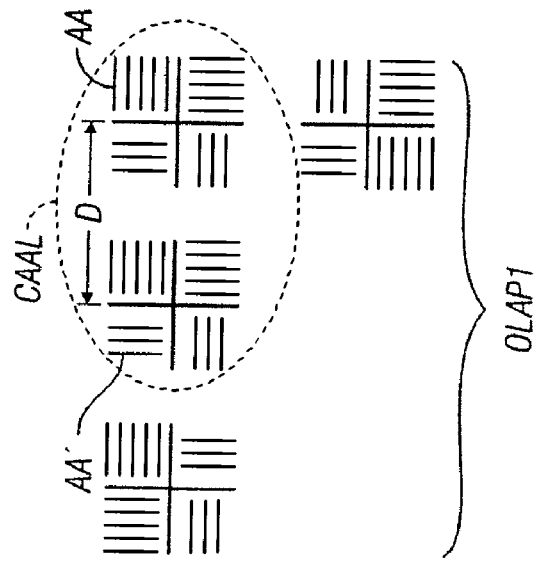

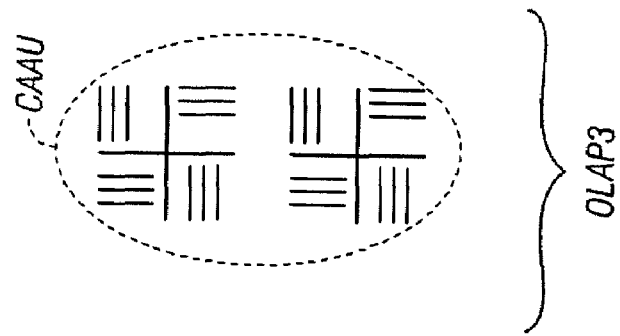
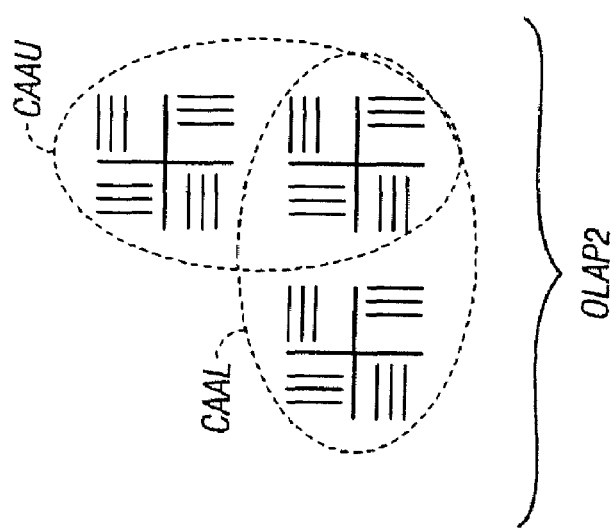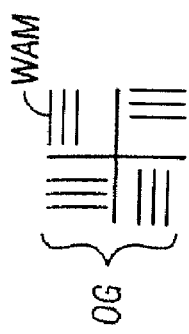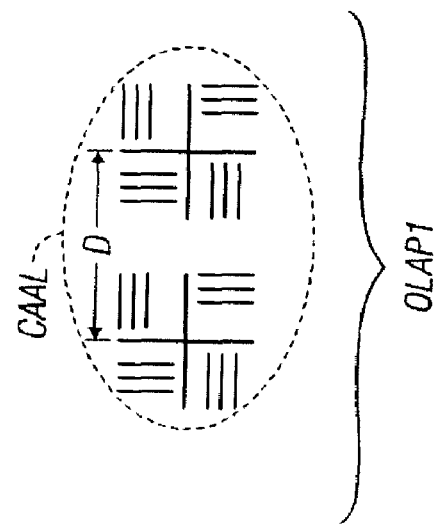
FIG. 25    FIG. 26

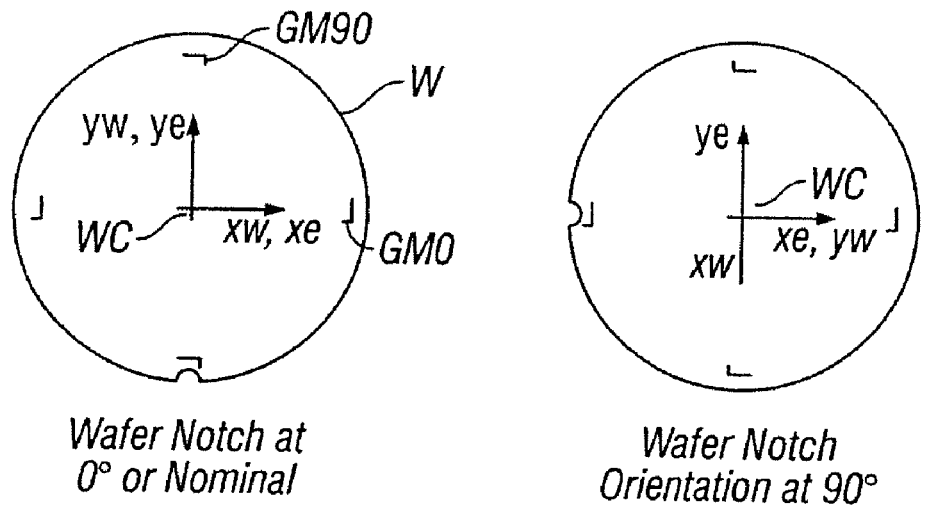
Wafer Notch at 0° or Nominal
Wafer Notch Orientation at 90°
FIG. 27
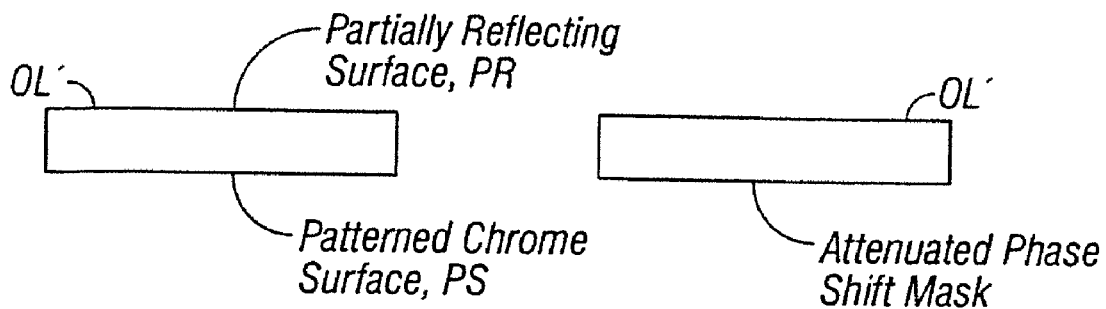
FIG. 28
FIG. 29
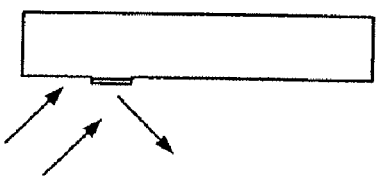
FIG. 30

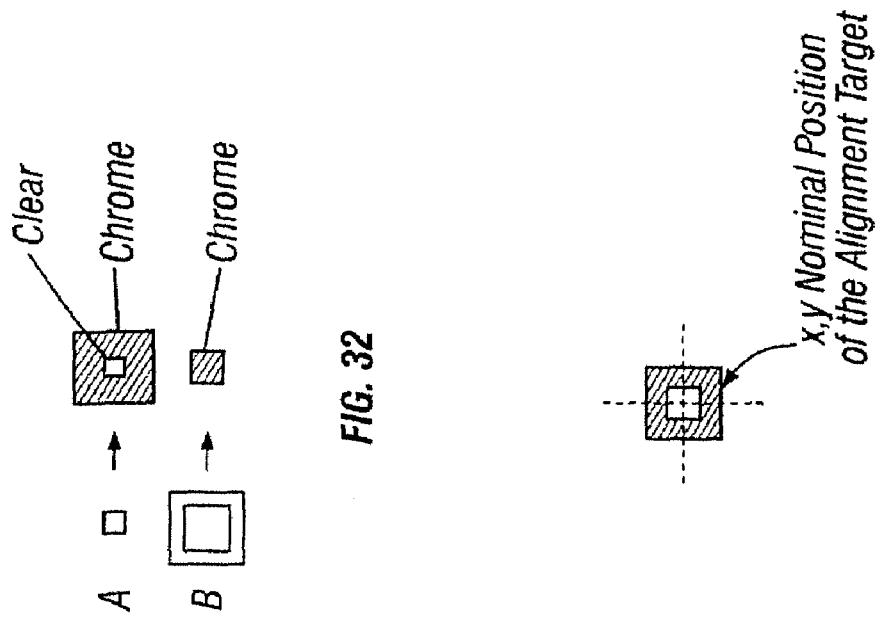
FIG. 32
FIG. 33
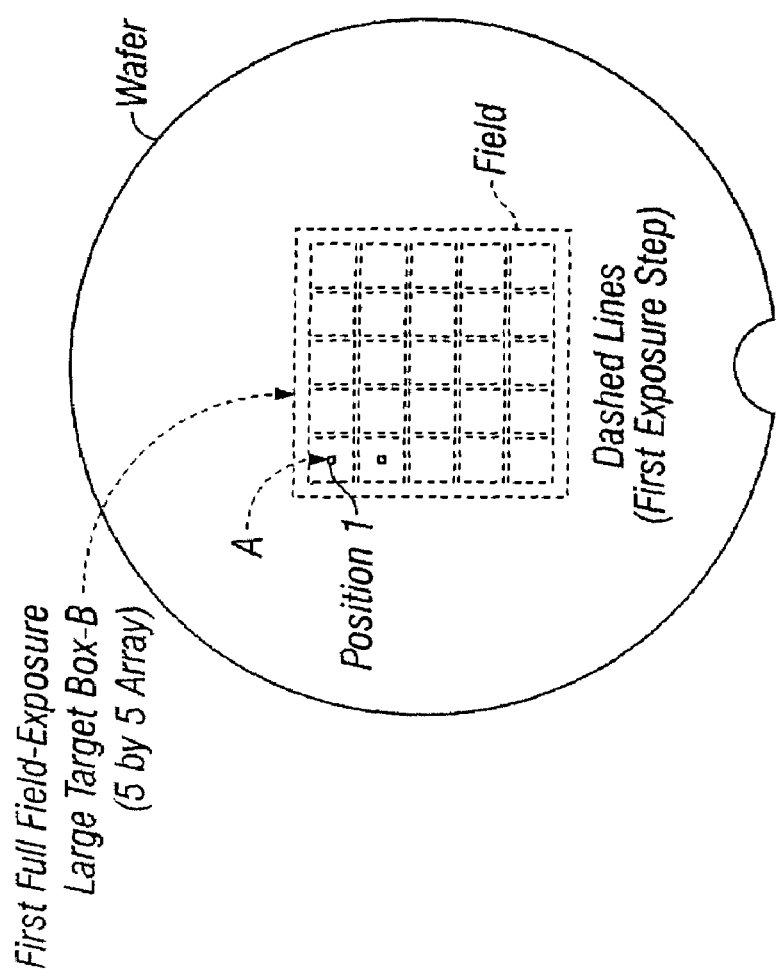
FIG. 31

RETICLE FOR USE IN RAPID DETERMINATION OF AVERAGE INTRAFIELD SCANNING DISTORTION HAVING TRANSMISSIVITY OF A COMPLEMENTARY ALIGNMENT ATTRIBUTE BEING DIFFERENT THAN THE TRANSMISSIVITY OF AT LEAST ONE ALIGNMENT ATTRIBUTE

REFERENCE TO PRIORITY DOCUMENT

This application is a continuation of U.S. patent application Ser. No. 11/102,382 filed on Apr. 8, 2005 now U.S. Pat. No. 7,262,398 which is a continuation-in-part of U.S. patent application Ser. No. 10/252,021, now U.S. Pat. No. 6,906,303 which claimed the benefit of priority of U.S. Provisional Patent Application Ser. No. 60/323,577 filed Sep. 20, 2001 and are all hereby incorporated by reference.

BACKGROUND

1. Field of the Invention

The present invention relates generally to processes for semiconductor manufacturing and more particularly to characterizing and monitoring the intra-field distortions of scanning projection systems used in ULSI photolithography.

2. Description of the Related Art

Today's lithographic processing requires ever tighter layer-to-layer overlay tolerances to meet device performance requirements. Overlay registration on critical layers can directly impact device performance, yield and repeatability. Typical microelectronic devices or circuits may have as many as 20 or more levels or pattern layers. The placement of patterned features on one level must match the placement of corresponding features on other levels—that is, they must overlap—within an accuracy which is some fraction of the minimum feature size or critical dimension (CD).

Overlay error is typically, although not exclusively, measured with a metrology tool appropriately called an overlay tool using several techniques. See Semiconductor Pattern Overlay, N. Sullivan, SPIE Critical Reviews Vol. CR52, 160: 188. The term overlay metrology tool or overlay tool means any tool capable of determining the relative position of two alignment attributes that are separated within about 2000 um (microns) of each other. The importance of overlay error, and its impact on yield, have been extensively studied and documented. See Measuring Fab Overlay Programs, R. Martin et al., SPIE Conference on Metrology, Inspection, and Process Control for Microlithography XIII, 64:71, March 1999; A New Approach to Correlating Overlay and Yield, M. Preil et al., SPIE Conference on Metrology, Inspection, and Process Control for Microlithography XIII, 208:216, March 1999.

Lithographers have created statistical computer algorithms (for example, Klass II (See Lens Matching and Distortion Testing in a Multi-Stepper, Sub-Micron Environment, A. Yost et al., SPIE Vol. 1087, 233:244, 1989) and Monolith (See A Computer Aided Engineering Workstation for Registration Control, E. McFadden et al., SPIE Vol. 1087, 255:266, 1989)) that attempt to quantify and divide overlay error into repeatable or systematic and non-repeatable or random effects. See Matching of Multiple Wafer Steppers for 0.35 Micron Lithography Using Advanced Optimization Schemes, M. van den Brink et al., SPIE Vol. 1926, 188:207, 1993; A Computer Aided Engineering Workstation for Registration Control, supra; Semiconductor Pattern Overlay, supra; Machine Models and Registration, T. Zavecz, SPIE Critical Reviews Vol. CR52, 134:159. An overall theoretical review of overlay modeling can be found in the literature. See Semiconductor Pattern Overlay, supra.

Overlay error is typically divided into the following two major categories. The first category, inter-field or grid overlay error, is concerned with the actual position of the translation and rotation or yaw of the image field as recorded in the photoresist on a silicon wafer using an exposure tool, i.e., stepper or scanner. The second category, intra-field overlay error, is the positional offset of an individual point inside a field referenced to the nominal center of an individual exposure field. Intra-field overlay errors are generally composed of lens aberrations or distortions, scanning irregularities, and reticle alignment It is important for this discussion to realize that most overlay measurements are made on silicon product wafers after each photolithographic process, prior to final etch. Product wafers cannot be etched until the photoresist target patterns are properly aligned to the underlying target patterns. See Super Sparse Overlay Sampling Plans: An Evaluation of Methods and Algorithms for Optimizing Overlay Quality Control and Metrology Tool Throughput, J. Pellegrini, SPIE Vol. 3677, 72:82. Manufacturing facilities rely heavily on exposure tool alignment and calibration procedures to help insure that the scanner tools are aligning properly. See Stepper Matching for Optimum Line Performance, T. Dooly et al., SPIE Vol. 3051, 426:432, 1997; Mix-and-Match: A Necessary Choice, R. DeJule, Semiconductor International, 66:76, February 2000; Matching Performance for Multiple Wafer Steppers Using an Advanced Metrology Procedure, M. Van den Brink, et al., SPIE Vol. 921, 180:197, 1988. Inaccurate overlay modeling algorithms can corrupt the exposure tool calibration procedures and degrade the alignment accuracy of the exposure tool system. See Super Sparse Overlay Sampling Plans: An Evaluation of Methods and Algorithms for Optimizing Overlay Quality Control and Metrology Tool Throughput, supra.

Over the past 30 years the microelectronics industry has experienced dramatic rapid decreases in critical dimension by constantly improving photolithographic imaging systems. Today, these photolithographic systems are pushed to performance limits. As the critical dimensions of semiconductor devices approach 50 nm the overlay error requirements will soon approach atomic dimensions. See Life Beyond Mix-and-Match: Controlling Sub-0.18 Micron Overlay Errors, T. Zavecz, Semiconductor International, July 2000. To meet the needs of next generation device specifications new overlay methodologies will need to be developed. In particular, overlay methodologies that can accurately separate out systematic and random effects and break them into assignable causes will greatly improve device process yields. See A New Approach to Correlating Overlay and Yield, supra. In particular, those new overlay methodologies that can be implemented into advanced process control or automated control loops will be most important. See Comparisons of Six Different Intra-Field Control Paradigms in an Advanced Mix and Match Environment, J. Pellegrini, SPIE Vol. 3050, 398:406, 1997; Characterizing Overlay Registration of Concentric 5× and 1× Stepper Exposure Fields Using Inter-Field Data, F. Goodwin et al., SPIE Vol. 3050, 407:417, 1997. Finally, another area where quantifying lens distortion error is of vital concern is in the production of photo masks or reticles during the electron beam manufacturing process. See Handbook of Microlithography and Microfabrication, P. Rai-Choudhury, Vol. 1, 417 1997.

Semiconductor manufacturing facilities use some version of the following complex overlay procedure to help determine the magnitude of intra-field distortion independent of other sources of systematic overlay error—in fact, the technique is used for both photolithographic steppers and scanners. The technique has been simplified for illustration. See Analysis of Image Field Placement Deviations of a 5× Microlithographic Reduction Lens, D. MacMillen et al., SPIE Vol. 334, 78:89, 1982. FIG. 33 shows a typical overlay target—one large or outer box and one small or inner target box. FIG. 31 shows a typical portion of a distortion test reticle used in the prior art. It should be noted that the chrome target patterns on most reticles are 4 or 5 times larger as compared with the patterns they produce at the image plane, this simply means modern step and scan systems (scanners) are reduction imaging systems. Further, for purposes of discussion, it is assumed that the reticle pattern is geometrically perfect, (in practice, the absolute positions of features on the reticle can be measured and the resulting errors subtracted off). First, a wafer covered with photoresist is loaded onto the wafer stage and globally aligned. Next, the full-field image of the reticle, see FIG. 2, is exposed onto the photoresist-coated wafer. See FIGS. 31 and 32. For purposes of illustration, it is assumed that the distortion test reticle consists of a 5×5 array of outer boxes evenly spaced a distance M*P, across the reticle surface, see FIG. 2. It is typically assumed that the center of the optical system is virtually aberration free. See Analysis of Image Field Placement Deviations of a 5× Microlithographic Reduction Lens, supra. With this assumption, the reticle, shown in FIG. 2 is now partially covered using the virtual reticle blades, as shown in FIG. 18, in such a way that only a single target at the center of the reticle field, box A in FIG. 2, is available for exposure. Next, the wafer stage is moved in such a way as to align the center of the reticle pattern directly over the upper left hand corner of the printed 5×5 outer box array, wafer position 1 in FIG. 31. The scanner then exposes the image of the small target box onto the photoresist coated wafer. If the wafer stage, optical system and scanning dynamics were truly perfect then the image of the small target box would fit perfectly inside the image of the larger target box, see FIG. 33, from the previous exposure. At this point the scanner and wafer stage are programmed to step and expose the small target box in the 5×5 array where each exposure is separated from the previous one by the stepping distance P.

With the assumption of a perfect stage, the final coordinates of the small target boxes are assumed to form a perfect grid, where the spacing of the grid is equal to the programmed stepping distance, P. Finally, if the first full-field exposure truly formed a perfect image, then the entire 5×5 array of smaller target boxes would fit perfectly inside the 5×5 array of larger target boxes. Since the first full-field exposure pattern is in fact distorted due to an imperfect imaging system (and scanner system) the actual position of the larger target box will be displaced relative to the smaller target boxes. The wafer is then sent through the final few steps of the lithographic process to create the final photoresist patterned overlay targets.

The resulting overlay error at each field position can be measured with a standard optical overlay tool and the result is interpreted as being intra-field error. Using the models described below in Equations 1 and 2, the overlay data can be analyzed and the lens distortion error is calculated.

The following intra-field modeling equations are commonly used to fit the overlay data using a least square regression technique. See Analysis of Image Field Placement Deviations of a 5× Microlithographic Reduction Lens, supra; Super Sparse Overlay Sampling Plans: An Evaluation of Methods and Algorithms for Optimizing Overlay Quality Control and Metrology Tool Throughput, supra.

$$dxf(xf,yf)=Tx+s*xf-q*yf+t1*xf^2+t2*xf*yf-E*(xf^3+xf*yf^2) \quad \text{eq.) 1}$$

$$dyf(xf,yf)=Ty+s*yf+q*xf+t2*yf^2+t1*xf*yf-E*(yf^3+yf*xf^2) \quad \text{eq.)2}$$

where;

(xf,yf)=intra-field coordinates (dxf,dyf)(xf,yf)=intra-field distortion at position (xf, yf)

(Tx, Ty)=(x,y) intra-field translation s=intra-field overall scale or magnification q=intra-field rotation (t1, t2)=intra-field trapezoid error E=intra-field lens distortion.

A problem with this technique is two-fold, first, it is standard practice to assume that the wafer stage error is very small, randomly distributed, and can be completely accounted for using a statistical model. See Analysis of Image Field Placement Deviations of a 5× Microlithographic Reduction Lens, supra; A "Golden Standard" Wafer Design for Optical Stepper Characterization", K. Kenp et al., SPIE Vol. 1464, 260:266, 1991; Matching Management of Multiple Wafer Steppers Using a Stable Standard and a Matching Simulator, M. Van den Brink et al., SPIE Vol. 1087, 218:232, 1989; Matching Performance for Multiple Wafer Steppers Using an Advanced Metrology Procedure, supra. In general, positional uncertainties in the wafer stage introduces both systematic and random errors, and since the intra-field distortion is measured only in reference to the lithography tool's wafer stage, machine to machine wafer stage differences show up as inaccurate intra-field distortion maps. Secondly, the assumption that lens distortion is zero at the center of the lens is incorrect. Furthermore, the model represented by Equations 1 and 2 is entirely unsuited to modeling scanner overlay error—typically the intra-field distortion model accounts only for scanner skew and scanner scale overlay errors—in general, the synchronization errors between the reticle stage and wafer stage introduce more complex errors described below.

A technique for stage and 'artifact' self-calibration is described in See Self-Calibration in two-Dimensions: The Experiment, M. Takac et al., SPIE Vol. 2725, 130:146, 1996; Error Estimation for Lattice Methods of Stage Self-Calibration, M. Raugh, SPIE Vol. 3050, 614:625, 1997. It consists of placing a plate (artifact) with a rectangular array of measurable targets on a stage and measuring the absolute positions of the targets using a tool stage and the tool's image acquisition or alignment system. This measurement process is repeated by reinserting the artifact on the stage but shifted by one target spacing in the X-direction, then repeated again with the artifact inserted on the stage shifted by one target spacing in the Y-direction. Finally, the artifact is inserted at 90-degrees relative to its initial orientation and the target positions measured. The resulting tool measurements are a set of (x, y) absolute positions in the tool's nominal coordinate system. Then, the absolute positions of both targets on the artifact and a mixture of the repeatable and non-repeatable parts of the stage x, y grid error are then determined to within a global translation (Txg, Tyg), rotation (qg) and overall scale ((sxg+syg)/2) factor.

This technique has several drawbacks, including that it requires that the measurements be performed on the same machine that is being assessed by this technique. Furthermore, this technique requires measurements made on a tool in absolute coordinates; the metrology tool measures the absolute position of the printed targets relative to its own nominal center; so absolute measurements are required over the entire imaging field, with a typical size greater than about 100 mm$^2$).

Another technique for the determination of intra-field distortion is the method of Smith, McArthur, and Hunter (U.S. Pat. No. 6,573,986). It is a self-referencing technique that can be utilized with overlay metrology tools in a production environment. For diagnosing the intra-field scanner distortion in the presence of significant scanner non-repeatability, this technique teaches the use of a special reticle that has reduced optical transmission that is multiply scanned producing sub-Eo exposures on the wafer. The result is that this technique can be used to accurately determine the repeatable part of the scanner intra-field distortion but not that part of the intra-field distortion that changes from scan to scan, a simple example of which is the scanner y-magnification.

Another drawback to these techniques to determine intra-field error is that they use the scanner itself as the metrology tool. Due to the cost of scanners, which can exceed 10 million dollars, it is desirable to have a technique for intra-field error that does not use the scanner itself as the metrology tool for determining intra-field distortion but utilizes relatively inexpensive overlay metrology tools. Furthermore, it is desirable that the technique be easy to perform thereby allowing it to be used in a production environment by the day-to-day operating personnel. It is further desirable to have a technique that measures the non-repeatable parts of the scanner intra-field distortion.

Therefore there is a need for an effective, and efficient, way to determine the scanner intra-field error.

SUMMARY

In accordance with the invention, techniques for determining lens distortion in a projection imaging tool are described. The techniques include exposing at least one alignment attribute onto a substrate having a recording media. A complementary alignment attribute is also exposed onto the substrate such that the complementary alignment attribute and alignment attribute form a completed alignment attribute. The exposure of the alignment attributes, or the complementary alignment attributes, or both, may be accomplished by multiple sub nominal exposures. The completed alignment attributes will also be referred to as overlay targets.

An aperture in the projection imaging tool may be adjusted such that the exposure of the alignment attributes covers an entire field of view of the tool. The aperture can also be adjusted so that only the complementary attribute will be exposed. An intra field distortion is reconstructed from measurements of relative positions of the exposed alignment attribute and complementary alignment attribute.

The alignment attributes and complementary alignment attributes may be provided as part of a reticle. The transmissivity of the alignment attribute may be different than the transmission of the complementary alignment attribute. For example, the transmission of the alignment attribute may be greater than the transmission of the complementary alignment attribute. Alternatively, the transmissivity of the alignment attribute can be less than the transmissivity of the complementary alignment attribute. Also, the transmissivity of some of the alignment attributes may be different than the transmissivity of others of the alignment attributes. If the attributes are provided as part of a reticle, then the difference in transmissivity of different portions of the reticle may be accomplished in various ways. For example, differential transmission can be achieved by use of phase shift mask material, reflective material, or anti-reflective material.

The substrate that the attributes are exposed onto can include a variety of materials, such as a semiconductor wafer, a flat panel display, a reticle, or an electronic recording media. The recording media is typically a positive photoresist material, a negative photoresist material, an electronic CCD, a diode array, a liquid crystal, or an optically sensitive material. Also, the projection imaging tool may be a photolithograph step and scan machine, a photolithographic scanner machine, a scanning electron beam imaging system, a scanning direct write tool, a scalpel tool, a scanning extreme ultra-violet photolithographic tool, or a scanning x-ray imaging system.

The techniques can be used to improve semiconductor fabrication that uses a photolithographic projection tool. For example, a reticle with at least one alignment attribute and a complementary alignment attribute can be provided. The transmission of the alignment attribute may be different than the transmission of the complementary alignment attribute. The alignment attribute and complementary alignment attribute may be exposed onto a substrate having a recording media such that the complementary alignment attribute and alignment attribute form a completed alignment attribute. The exposure of the complementary alignment attribute may be accomplished by multiple sub nominal exposures. Intra field distortion of the projection imaging tool may be determined from measurements of the exposed alignment attribute and complementary alignment attributes.

The techniques overcome some of the drawbacks of stage metered lens distortion determination. For example, determining lens distortion with stage metered techniques generally assume that the stage moves nearly perfectly, thus these techniques inherently include effects of the wafer stage grid and yaw error due to stepping the reference pattern across the full field exposure. Typically, the non-repeatable parts of wafer stage grid and yaw error can be reduced by averaging over multiple tests of this type. In the case of a scanner, there is inherent intra-field variability due to scanning synchronization error varying on a scan by scan basis so in this case, it usually requires averaging over even more fields to average out both the stepped reference pattern and the scan-to-scan intra-field variability to extract average scan behavior. To improve performance, multiple exposure techniques and/or reduced transmission reticles are described so as to average away measurement noise for stage metered methodologies.

Other features and advantages of the present invention should be apparent from the following description of the preferred embodiment, which illustrates, by way of example, principles of the invention.

BRIEF DESCRIPTION OF THE DRAWINGS

FIG. 6 is a schematic of the reticle for the preferred embodiment for extracting dynamic intra-field scanning error.

FIG. 7 is an exemplary overlay group, OG, for a dark field mask with dimensions in microns.

FIG. 8 is a completed alignment attribute using AA and AA' of FIG. 7.

FIG. 18 shows a wafer after exposures done at 0 degrees and 90 degrees.

FIG. 23 shows an overlay group OG consisting of a pair of wafer alignment marks.

FIG. 24 shows overlapped overlay groups OLAP1, OLAP2, OLPA3 as realized with the overlay group of FIG. 23.

FIG. 25 shows an exemplary overlay group consisting of a single wafer alignment mark.

FIG. 26 shows overlapped overlay groups OLAP1, OLAP2, OLAP3 as realized with the overlay group of FIG. 25.

FIG. 27 shows the wafer coordinate systems used in the discussion of this invention.

FIG. 28 shows in cross section a partially transmitting variation of the present invention that utilizes a partially reflecting surface as the transmission reduction mechanism.

FIG. 29 shows in cross section a partially transmitting variation of the present invention that utilizes an attenuated phased shift mask on the surface as the transmission reduction mechanism.

FIG. 30 shows in cross section another variation of the present invention that utilizes a reflective reticle.

FIG. 31 shows an example of a prior art lens distortion test exposure pattern.

FIG. 32 explains the schematics used in FIG. 2.

FIG. 33 shows a perfectly overlaid box in box structure.

DETAILED DESCRIPTION

An aspect of the invention is that it does not require that measurements be made on the same machine that is being assessed accordingly determining the intra-field lens distortion can, and preferably are, made on an overlay metrology tool quite distinct from the projection lithography tool that we are assessing.

Another aspect of the invention is that the absolute position of the printed targets relative to the nominal center of the metrology tool is not required, instead relative coordinates or displacements of features (box in box structures or some other alignment attribute) are measured with respect to each other. Because the distances between these alignment attributes is typically less than 2.0 mm absolute position is not required. In the case of box in box structures these distances are typically less than about 0.2 mm. This difference is a significant one since absolute metrology tools such as the Leica LMS 2000, Leica IPRO (See Leica LMS IPRO Brochure), or Nikon 5I (See Measuring System XY-5i, K. Kodama et al., SPIE Vol. 2439, 144:155, 1995) typically cost in excess of 2 million dollars and are uncommon in semiconductor manufacturing facilities (fabs) while overlay metrology tools such as the KLA 5200, or Bio-rad Q7 typically cost 0.5 million dollars and are widely deployed in fabs. Another drawback of this technique is that it requires that the intra-field distortion to be repeatable from exposure to exposure, this is precluded by the scanner dynamics.

Another aspect of the invention is that it utilizes a procedure that greatly reduces the number of measurements required to determine the intra-field lens distortion. Furthermore, the technique allows for the determination of the non-repeatable part of the scanner dynamic distortion.

Figure 4:
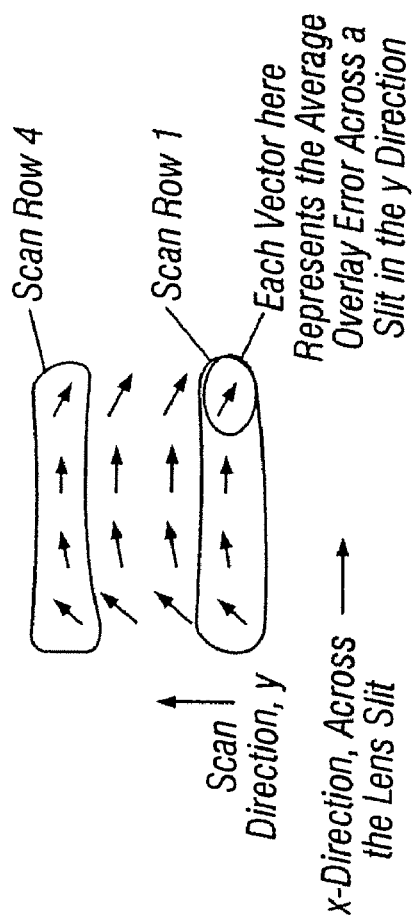
FIG. 4 shows vector plots or lens distortion error in the absence of scanner synchronization error.

The structure of scanner intra-field distortion or translational error can be decomposed into a lens component, dependent only on the projection imaging objective or projection system aberrations (See FIG. 4), and a scanning component, dependent only on the relative dynamics of the wafer and reticle scanning motion. (See FIG. 5.) The lens component is repeatable but the scanning component contains both repeatable and non-repeatable parts. Furthermore, the lens and scanning components have certain functional forms that simplify the extraction of intra-field error. A photolithographic step and scan or scanner system produces an image, typically reduced 4× or 5×, of the reticle pattern in the surface of the photoresist by continuously passing exposure radiation through a small portion of the projection optics as the reticle and wafer stage travel in opposite directions, as shown in FIG. 18. The scanning reticle stage and scanning wafer stage move in opposite directions in a coordinated manner at two different speeds.

Figure 1:
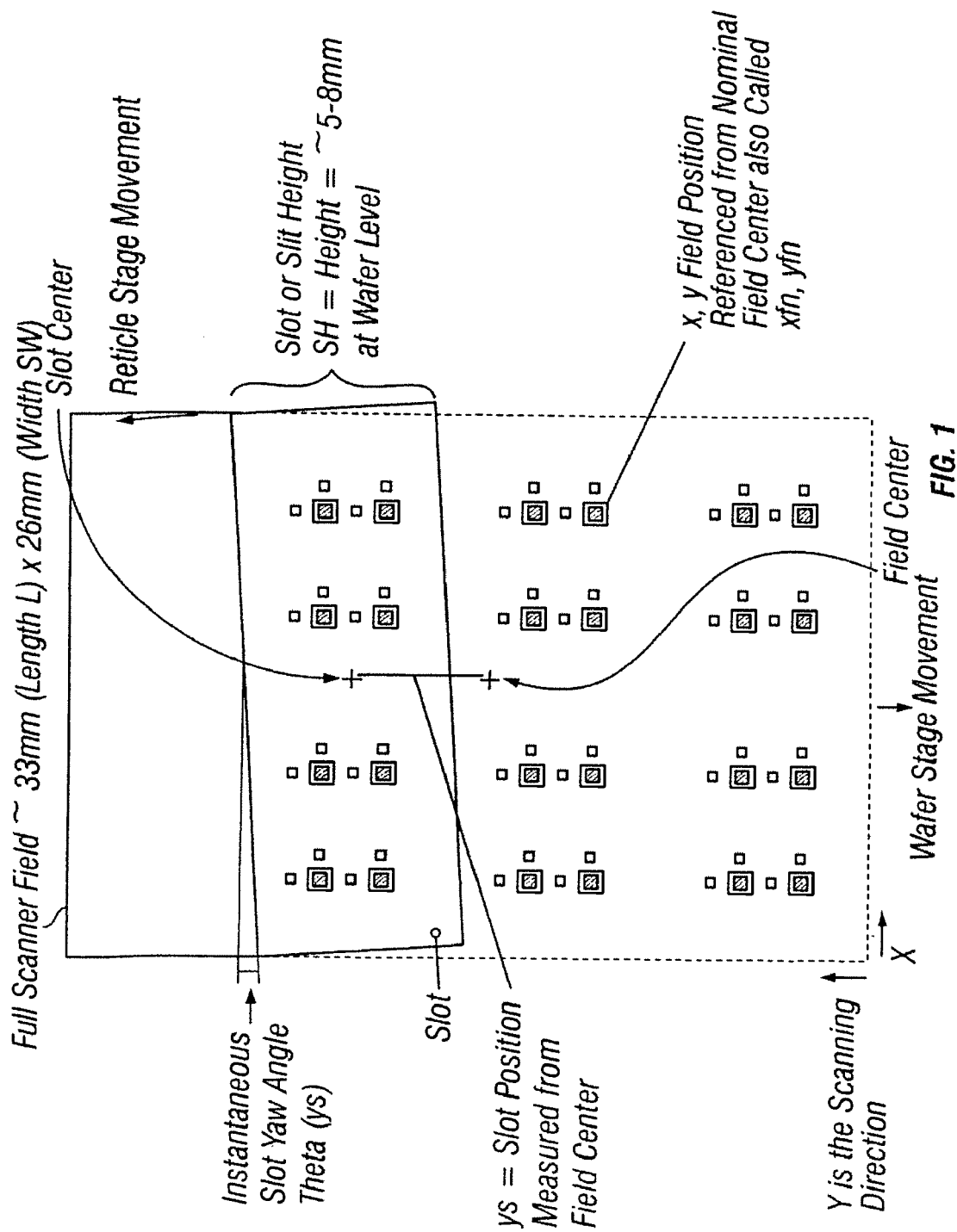
FIG. 1 shows a scanner exposure field, scanner slit and scanner coordinate system.
Figure 2:
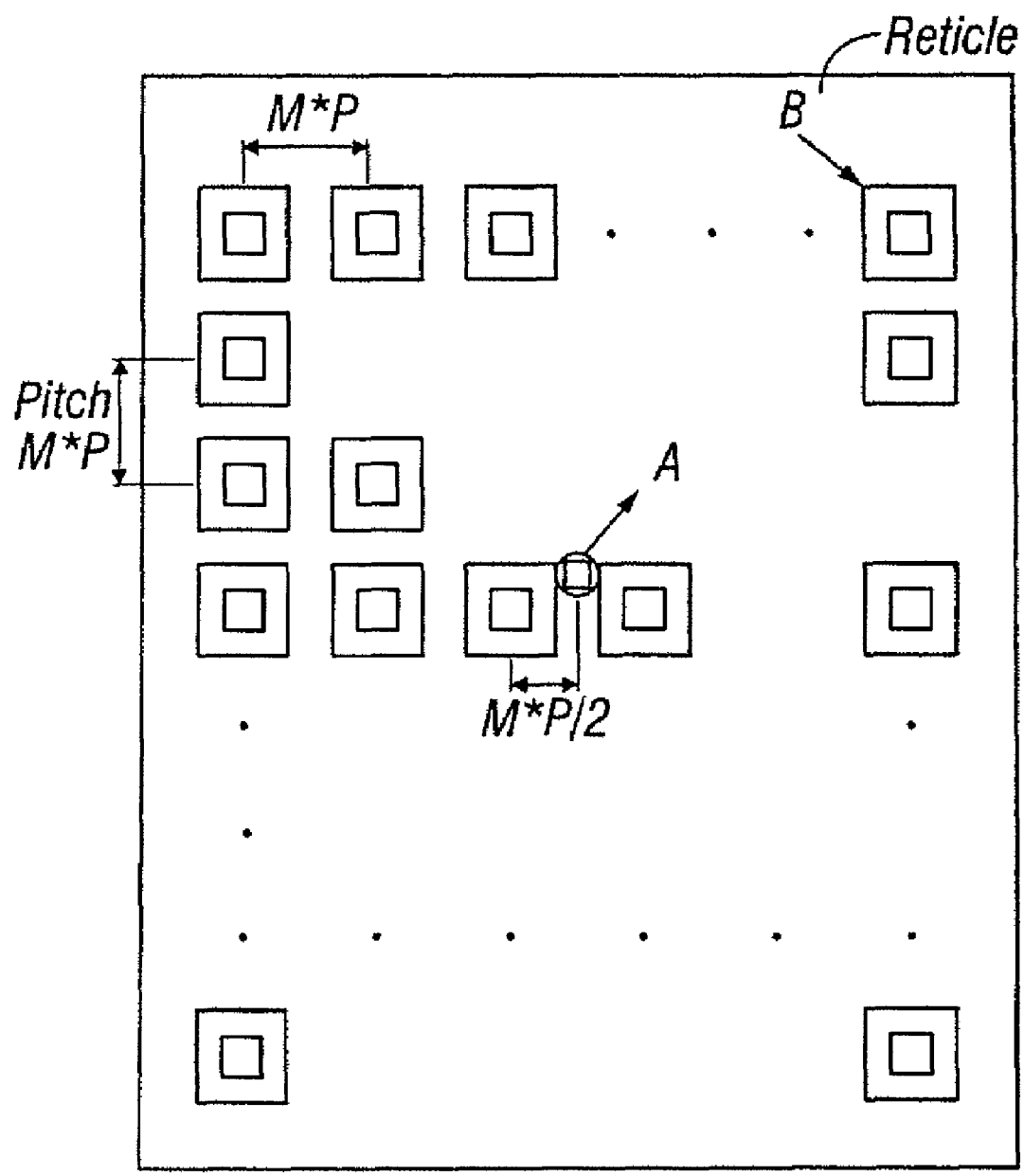
FIG. 2 schematizes a reticle used for stage metered scan and lens distortion.

FIG. 1 shows an instantaneous (top down) view of a partially exposed scanner field (and coordinate system) as it might appear on a photoresist coated silicon wafer during a scan. Lack of coordination between the wafer stage and reticle stage in the absence of lens distortion will manifest itself as translational offset error–$\Delta T(x,y,ys)$. Where $\Delta T(x,y,ys)$ is defined to be the instantaneous translational offset error on the wafer at intra-field position x,y—located inside the image of the lens slit—when the scanner is at position (ys), See FIG. 1. The final distortion error or overlay error ($\Delta F(x,y)$) at any point actually imaged in the photoresist is then an average of the instantaneous errors ($\Delta T(x,y,ys)$), weighted by the intensity function of the scanning slit. If the scanner operated perfectly (without synchronization or vibration errors) then the final distortion or translational error, $\Delta sL(x)$ at each field point in the photoresist would simply be the average of the static projection lens distortion $\Delta d(x)$ weighted by the intensity function of a static scanner slit. See aberration averaging; Performance of a Step and Scan System for DUV Lithography, G. de Zwart et al., SPIE Vol. 3051, 817:835, 1997.

Thus, there are two independent sources of transverse scanning error or scanning distortion; projection lens distortion error—that varies in magnitude and direction across the scanner field (in the x direction, or perpendicular to the scanning direction) and synchronization errors that represent an average of the instantaneous (repeatable and non-repeatable) positional offsets of the wafer and reticle stage.

Because the reticle and wafer move in a coordinated manner as rigid bodies relative to one another, lack of coordination will show up as instantaneous offset errors, ($\Delta Tx, \Delta Ty$) (x,y,ys). Here ($\Delta Tx, \Delta Ty$)(x,y,ys) is the instantaneous translational offset error of the projected image at the wafer relative to a perfectly placed wafer is a function not only of the intra-field coordinate (x,y) but also of the instantaneous position, ys, of the wafer relative to the center of the scanning slit. FIG. 1 shows the relation of the full scanner field and field center relative to the slot center, this relative position is ys. We are concerned here only with transverse errors of the stage and reticle and so the instantaneous offset vector ($\Delta Tx, \Delta Ty$) (x,y,ys) will depend only on the instantaneous translational offset error ($\Delta X(ys), \Delta Y(ys)$) and the instantaneous yaw or rotational error $\theta s(ys)$ as:

$$(\Delta Tx, \Delta Ty)(x,y,ys)=(\Delta X(ys)+\theta s(ys)*(y-ys), \Delta Y(ys)-\theta s(ys)*x) \qquad \text{eq. 3}$$

Another contributor to the instantaneous offset vector will arise from the static distortion contribution of the projection lens. Thus if ($\Delta Xsl, \Delta Ysl$)(x,y) is the static lens distortion then its contribution to the instantaneous offset vector ($\Delta Tx, \Delta Ty$) will be:

$$(\Delta Tx, \Delta Ty)(x,y,ys)=(\Delta Xsl, \Delta Ysl)(x,y-ys) \qquad \text{eq.3a}$$

The static lens distortion means the intra-field distortion of the scanner as determined when the wafer and reticle stages are not moved with respect to one another to produce the scanned image field. Thus, the static lens distortion does not include any contribution from synchronization or dynamic yaw errors due to the relative motion of the reticle and wafer stages. Referring to FIG. 1, ($\Delta Xsl, \Delta Ysl$)(x,y) is defined only over the slot width (SW) and slot height (SH). Therefore x, y vary over the ranges $$x=(-SW/2:SW/2) \ y=(-SH/2:SH/2) \qquad \text{eq.3b}$$

There are various techniques for determining ($\Delta Xsl, \Delta Ysl$), a very accurate technique is described in "Method And Apparatus For Self-Referenced Projection Lens Distortion Mapping" (U.S. Pat. No. 6,573,986) but this and other techniques for measuring static lens distortion are not required for the techniques described below.

Combining Equations 3 and 3a give the total contribution to the instantaneous offset error as:

$$(\Delta Tx, \Delta Ty)(x,y,ys)=(\Delta Xsl, \Delta Ysl)(x,y-ys)+(\Delta X(ys)+\theta s(ys))*(y-ys), \Delta Y(ys)-\theta s(ys)*x) \qquad \text{eq. 3c}$$

Here x,y vary over the entire span of intrafield coordinates;

$$x=(-SW/2:SW/2) \ y=(-L/2:L/2) \qquad \text{eq.3d}$$

while ys varies over the range:

$$ys=(y-SH/2:y+SH/2) \qquad \text{eq.3e}$$

Since the projected image suffers a shift only when the slot (or more precisely any part of the illuminated slot) is over field position (x,y).

The effect of the projected image is then just a weighted average over the slot of the instantaneous offsets ($\Delta Tx, \Delta Ty$):

$$(\Delta XF, \Delta YF)(x,y)=INT\{dys*w(y-ys)*(\Delta Tx, \Delta Ty)*(x,y,ys)\}/INT\{dys*w(y-ys)\} \qquad \text{eq. 3f}$$

where;

x,y=intrafield coordinates, x=(−SW/2:SW/2), y=(−L/2:L/2)

ys=the position of the center of the scanning slit at a given instant in time referenced from the nominal die center SW=slot width L=scanner field length dys=differential amount of the scanner field INT{ }=integral over the scanner field, integration range extends from ys=(−(L+SH)/2:(L+SH)/2))

w(y)=weighting function. In 248 nm resists, typically proportional to the slot intensity profile scanning slit. 0 for points outside the slit opening.

($\Delta XF, \Delta YF$)(x,y)=intrafield distortion. Includes effects of scanning synchronization error and lens aberrations.

The two distinct parts of ($\Delta Tx, \Delta Ty$) (scanner dynamics (eq. 3) and lens distortion (eq. 3a)) are additive and therefore the intrafield distortion, ($\Delta XF, \Delta YF$), can also be divided up into similar parts as:

$$(\Delta XF, \Delta YF)(x,y)=(\Delta xL, \Delta yL)(x)+(\Delta XS(y), \Delta YS(y)-x*d\Delta YS(y)/dx) \qquad \text{eq. 3g}$$

where the lens aberration contribution, ($\Delta xL, \Delta yL$)(x), is given by;

$$(\Delta xL, \Delta yL)(x)=INT\{dys*w(y-ys)*(\Delta Xsl, \Delta Ysl)(x,y-ys)\}/INT\{dys*w(y-ys)\} \qquad \text{eq. 3h}$$

and the scanning dynamics contribution, ($\Delta XS(y), \Delta YS(y)-x*d\Delta YS(y)/dx$), is given by;

$$(\Delta XS(y), \Delta YS(y)-x*d\Delta YS(y)/dx)=INT\{dys*w(y-ys)*(\Delta X(ys)+\theta s(ys)*(y-ys), \Delta Y(ys)-\theta s(ys)*x)\}/INT\{dys*w(y-ys)\} \qquad \text{eq. 3i}$$

Identifying separate components in Equations 3h) and 3i) gives the individual expressions for the various components of overlay error. Thus the dynamic slip in the x and y directions due to synchronization error is given by;

$\Delta XS(y)$=dynamic slip in the x direction=$INT\{dys*w(ys)*\Delta X(y-ys)\}/INT\{dys*w(ys)\}$ (eq.3j)

$\Delta YS(y)$=dynamic slip in the y direction=$INT\{dys*w(ys)*\Delta Y(y-ys)\}/INT\{dys*w(ys)\}$ (eq.3k)

the dynamic yaw or rotational error due to synchronization error is given by;

$d\Delta YS(y)/dx$=dynamic yaw=$INT\{dys*w(ys)*\theta s(ys))\}/INT\{dys*w(ys)\}$ (eq.3l)

The influence of the dynamic lens distortions on the intra-field error, $(\Delta xL, \Delta yL)$, is given by;

$\Delta xL(y)$=dynamic lens distortion in the x direction=$INT\{dys*w(ys)*\Delta Xsl(y-ys)\}/INT\{dys*w(ys)\}$ (eq.3m)

$\Delta yL(y)$=dynamic lens distortion in the y direction=$INT\{dys*w(ys)*\Delta Ysl(y-ys)\}/INT\{dys*w(ys)\}$ (eq.3n)

The interpretation of the structure of the intra-field distortion, $(\Delta XF, \Delta YF)$, is best understood with reference to Equation 3g). There, the intra-field distortion is divided into a contribution by the dynamic lens distortion, $(\Delta xL, \Delta yL)$, that depends only on the cross scan coordinate, x, and is independent of the position along the scanning direction, y. From equations 3m) and 3n), the dynamic lens distortion is a weighted average of the static lens distortion where the weighting factor, w(y), depends on the intensity distribution in the scan direction, y, possibly the photoresist process, and the scanning direction. Because the dynamic lens distortion contains none of the effects of scanning synchronization errors and only effects that are highly repeatable, the dynamic lens distortion will not vary from scan to scan. Thus, the contribution of dynamic lens distortion to the intrafield distortion can be some arbitrary set of vector displacements along a single scan row but will be the same for all rows in the scan, see FIG. 4.

Figure 5:
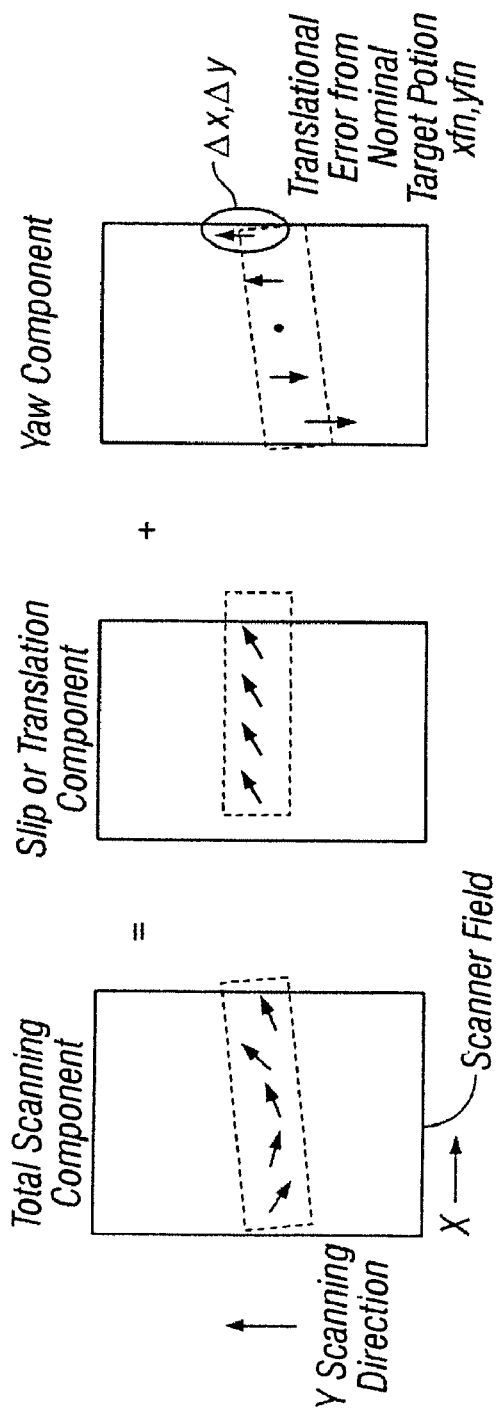
FIG. 5 shows the components making up the instantaneous scanning synchronization error.

The other contributor to intra-field distortion in Equation 3g) is the dynamic slip and yaw errors, $\Delta XS(y)$, $\Delta YS(y)$, $d\Delta YS(y)/dx$, which depend on the position along the scanning direction, y, and are independent of the cross scan coordinate, x. From Equations 3j), 3k), 3l) the dynamic slip and yaw are convolutions of the weighting factor w(y) with the instantaneous translational and yaw offsets. Because dynamic slip and yaw contain nothing but the effects of scanner synchronization error, they will contain both repeatable parts that do not vary from scan to scan and non-repeatable parts that vary from scan to scan. Referring to FIG. 5, each row of the scan will have different translation and rotation errors that are generally different and strongly correlated only over distances less than about SH, the slot height.

In summary, in the presence of both lens distortion and scanner synchronization error the total overlay distortion error, $[\delta X(x,y), \delta Y(x,y)]$ can be expressed in the following form;

$\delta X(x,y)=\Delta XS(y)+\Delta xL(x)$, (eq.12)

$\delta Y(x,y)=\Delta YS(y)+\Delta yL(x)-x*d\Delta YS(y)/dx$ (eq.13)

In acid catalyzed photoresists such as those used for KrF or 248 nm lithography, the weighting function will typically be directly proportional to the intensity of light, I(y), across the slot since the latent acid image does not saturate until at very high exposure doses. However, in typical I-line photoresists the latent image saturates at normal exposure doses. This means that at a given location on the photoresist, the exposing light that first impinges consumes a larger portion of the photoactive material than an equal amount of exposing light impinging at a later time. Thus the w(y) will not be proportional to I(y) any longer. Because of this saturation effect, the weighting function will depend not only on the photoresist exposure dose used but also on the scanning direction (positive y or negative y).

First Embodiment

Figure 12:
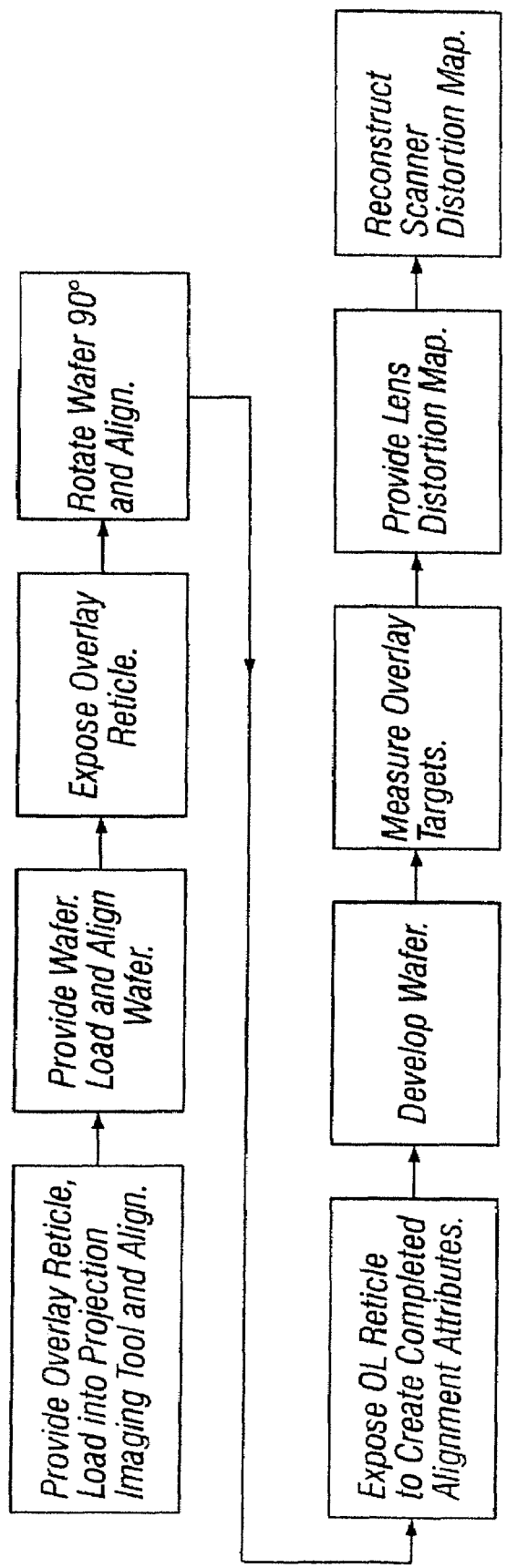
FIG. 12 shows the process flow for the preferred embodiment of this invention.

A method for determining the distortion associated with scanner synchronization error (scan error for short) to within a translation, rotation, and skew in the presence of scanner lens distortion is described. The process flow for the first embodiment is diagramed in FIG. 12.

Provide Reticle

Figure 9:
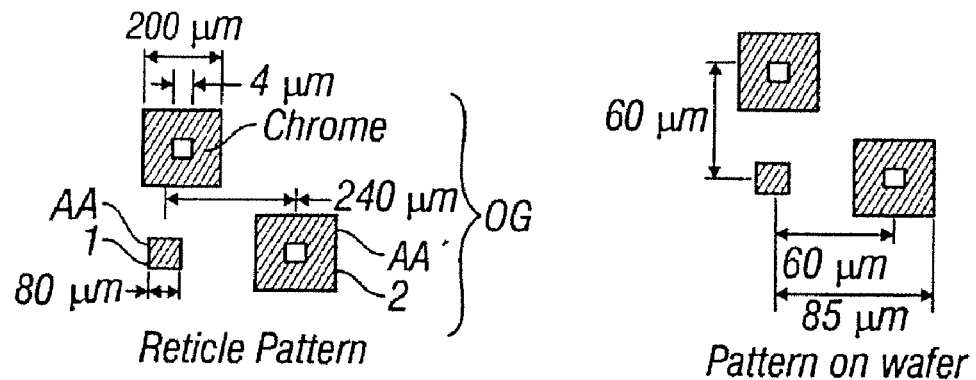
FIG. 9 shows on the left exemplary overlay group OG for a bright field mask and on the right overlay group OG as projected onto the wafer at 4:1 reduction.

Referring to FIG. 6, a reticle, OL, with an (MxxMy) array of overlay groups, OG, is provided, loaded into a projection lithography tool (machine) being measuring, and aligned to reticle alignment mark RM. Reticle OL, shown in cross section in FIG. 11, may be a glass or fused silica reticle with a chrome coating that defines the overlay groups, OG; it is a binary mask. FIGS. 7 and 9 show realizations of OG for the first embodiment. They both consist of alignment attributes, AA, and complementary alignment attributes, AA', offset from AA a distance M*dp. When overlaid one on top of another, AA and AA' form completed alignment attributes, CAA, illustrated in FIGS. 8 and 10. FIG. 8 is the completed alignment attribute, CAA, as viewed on the wafer consisting of the projection of alignment attribute AA and complementary alignment attribute AA' of FIG. 7 on top of one another. The inner square torus of FIG. 8 represents the projection of AA' while the outer square torus represents the projection of AA onto the wafer. The darkened areas represent exposed photoresist or other recording media.

FIG. 7 is a realization of overlay group OG for a dark field mask. The darkened areas represent chrome removed from the reticle and typical dimensions in microns are shown. These dimensions are appropriate when overlay reticle OL is used in a 4:1 (M=4 in FIG. 6) or 5:1 (M=5 in FIG. 6) reduction imaging tool. When used in a 1:1 imaging tool (no magnification or demagnification of the image size) the dimensions shown in FIG. 7 would be reduced by approximately 4-5 times so that the completed alignment attributes (CAA of FIG. 8) would be within the recommended size range for bar in bar structures suitable for an overlay metrology tool, typically about 15-30 um. See Overlay Target Design, KLA-Tencor, KLA-Tencor, 1:4, 1996. M*dp of FIG. 6 is the distance between alignment attributes AA and their complements AA' and for the example of FIG. 7 is equal to 500 microns.

Figure 10:
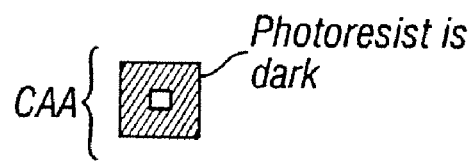
FIG. 10 shows a completed alignment attribute using AA and AA' of FIG. 9 as printed in positive photoresist.
Figure 11:
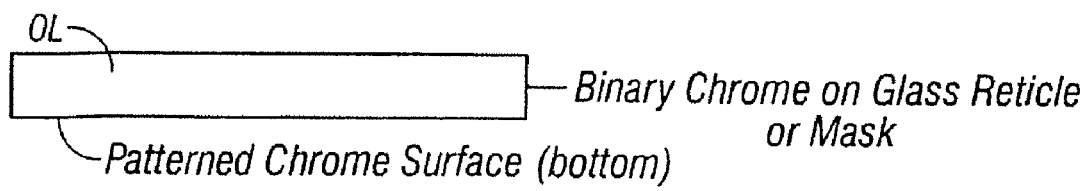
FIG. 11 is a side view of the reticle of FIG. 6.

FIG. 9 is another realization of overlay group OG, this time for a bright field mask. The darkened areas represent chrome remaining on the reticle and typical dimensions in microns are shown. These dimensions are appropriate when overlay reticle OL is used in a 4:1 (M=4 in FIG. 6) or 5:1 (M=5 in FIG. 6) reduction imaging tool. The same comments above apply to the design basis for this size and adaptation to imaging tools with other magnifications, M. M*dp of FIG. 6 is the distance between alignment attributes AA and their complements AA' and for the example of FIG. 9 is equal to 500 microns. FIG. 10 is the completed alignment attribute, CAA, as viewed on the wafer consisting of the projection of alignment attribute AA and complementary alignment attribute AA' of FIG. 9 on top of one another. The inner square box of FIG. 8 represents the projection of AA' while the outer square box represents the projection of AA onto the wafer. The darkened areas represent resist remaining on the wafer, in the case of a positive tone resist.

Referring to FIG. 6, overlay groups OG are separated a distance M*p" where p" is typically in the range of 0.5 mm to 10 mm when used on semiconductor wafers. M is the reduction magnification ratio of the projection imaging tool used. For semiconductor manufacturing this is typically M=1, 4 or 5, most commonly 4 or 5. Thus an exemplary dimension for M*p" for an M=4 or M=5 system is 4 mm leading to a pitch, p", of the projected pattern on the wafer of p"=1 mm (M=4) or p"=0.8 mm (M=5). Typical values for p" are in the range of 0.5 mm to 10 mm while typical values for dp are 0.02 mm to 1 mm. The significant constraint on p" is that it be small enough to provide detailed enough coverage of the scan distortion pattern. Stated differently, we need to sample the scan distortion at a fine enough interval such that the distortions at the unmeasured locations in between the overlay groups are reasonably approximated (error less than 30% maximum distortion) by interpolating the values of scan distortion measured on pitch p". The significant constraint on offset dp is that it lie within an area where the scan distortion is not varying significantly. Stated differently, the overlay group of FIG. 6 should lie within an isoplanatic distortion patch of the scan field, herein defined as being a region over which the scanner distortion varies by <5% of the maximum value of the scan distortion.

Also disposed on overlay reticle OL will be reticle alignment marks, RM, that allow the reticle to be precisely aligned with respect to the projection imaging tool it is used on.

The number of overlay groups OG on reticle OL is determined by the maximum projected field size of the machine or set of machines we will be measuring. In cases where the extent of the overlay groups on the reticle exceeds the size of the maximum field, the entire Mx×My array is not required, a smaller section that fits within the maximum field or other user designated field will work with the method of this invention.

Load/Align Reticle

Next, overlay reticle OL is loaded into the projection lithography tool (machine) and aligned. The reticle alignment is typically carried out using reticle alignment marks, RM. On lower accuracy machines, larger alignment attributes AA and their complements, AA', when combined with mechanical banking or placement of the reticle may suffice for reticle alignment. In these circumstances, no reticle alignment marks would be required.

Provide/Load/Align Wafer

Figure 16:
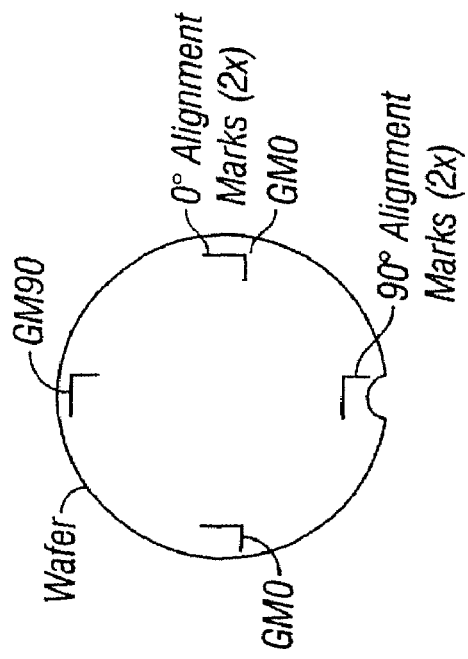
FIG. 16 shows a wafer with wafer alignment marks suitable for using the wafer at 0 and 90 degree orientations.

Next, a photoresist coated wafer is provided. Referring to FIG. 16, this wafer may have already disposed on it global wafer alignment marks GM0 and GM90. GM0 is the wafer alignment mark suitable for the wafer when it is loaded with the notch in the default or 0 degree orientation. Two marks, shown in FIG. 16, and possibly more, are typically required for wafer alignment. The required alignment accuracy for semiconductor wafers and standard box in box or bar in bar completed alignment attributes will typically be less than about 2 um. This is so the overlay tool metrology used for measuring the completed alignment attributes is operating in the regime where it is most accurate and repeatable. See KLA 5105 Overlay Brochure, KLA-Tencor. GM90 is the alignment mark suitable for the wafer when loaded with the notch in the rotated 90 degrees from the default or 0 degree orientation. Two marks are shown in FIG. 16. In cases where the wafer prealignment system can meet the required tolerances by aligning off of the wafer edge and notch, an unpatterned wafer can be used. Once provided, the wafer is then loaded and aligned on the projection lithography tool we are measuring.

Expose Reticle

Figure 17:
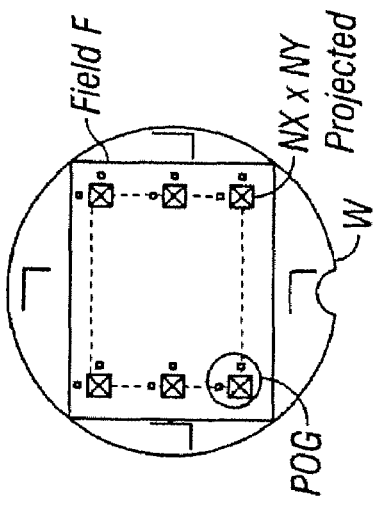
FIG. 17 shows a wafer after the first exposure for determining the dynamic scan distortion.

Next, referring to FIG. 17, overlay reticle OL is exposed projecting an Nx×Ny array of overlay groups, OG, from reticle OL onto wafer W resulting in an Nx×Ny array of projected overlay groups, POG, on wafer W. The entire projected array comprises a field F over which we will be measuring the machine dynamic scan distortion; the present invention will determine the synchronization or dynamic distortion present in this single realization of scanning distortion as present in the field F.

Rotate/Align Wafer

Following the first exposure the wafer is rotated by 90 degrees and realigned using global wafer alignment marks GM90. For the rotation step, the wafer may have to pass out through the track, skipping the resist development cycle and be passed back through track, skipping the resist coating cycle, and reinserted onto the wafer chuck. In some cases, the wafer may need to be rotated by hand approximately 90 degrees before the machine prealignment system can accommodate it. In any event, once the wafer has been rotated, it is then aligned as discussed above only the GM90 marks are utilized. In this case the global wafer alignment marks GM0 remain individually identical in appearance once they have been rotated by 90 degrees, then in their new position they can serve the same function as marks GM90. For the purposes of this invention the wafer can be rotated either clockwise or counterclockwise by 90 degrees. The description of the preferred embodiment assumes the wafer is rotated clockwise by 90 degrees as indicated by FIG. 27.

Expose OL Reticle to Create Completed Alignment Attributes

Figure 15:
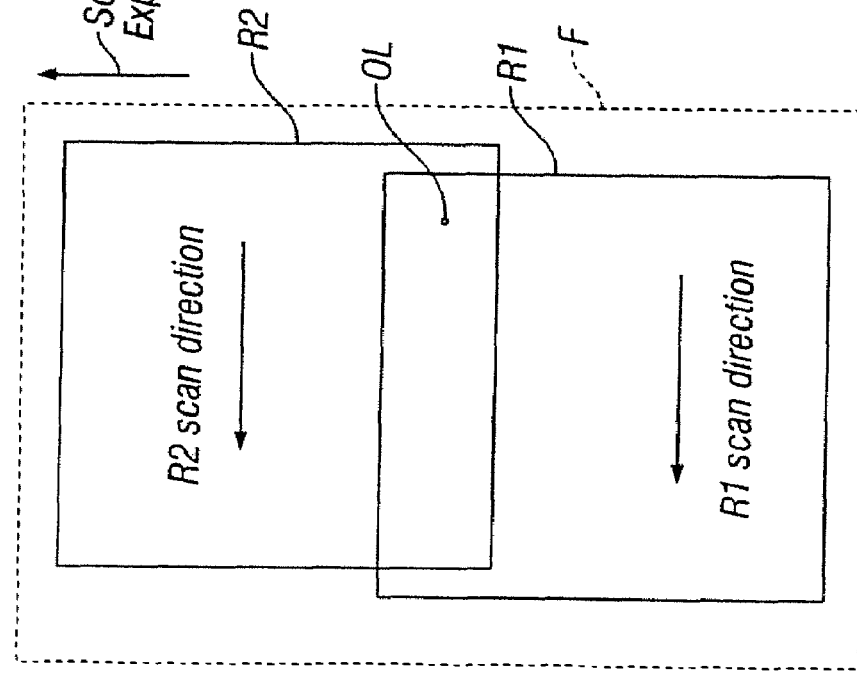
FIG. 15 shows an exposure plan for determining dynamic scan error of field F.
Figures 19, 20:
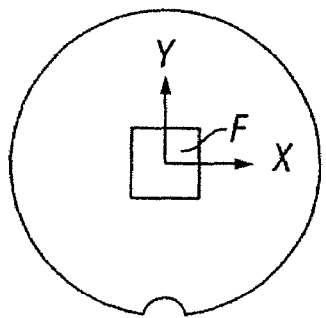
FIG. 19 shows the intrafield coordinate convention.
FIG. 20 shows schematics used in FIG. 18.
Figure 34:
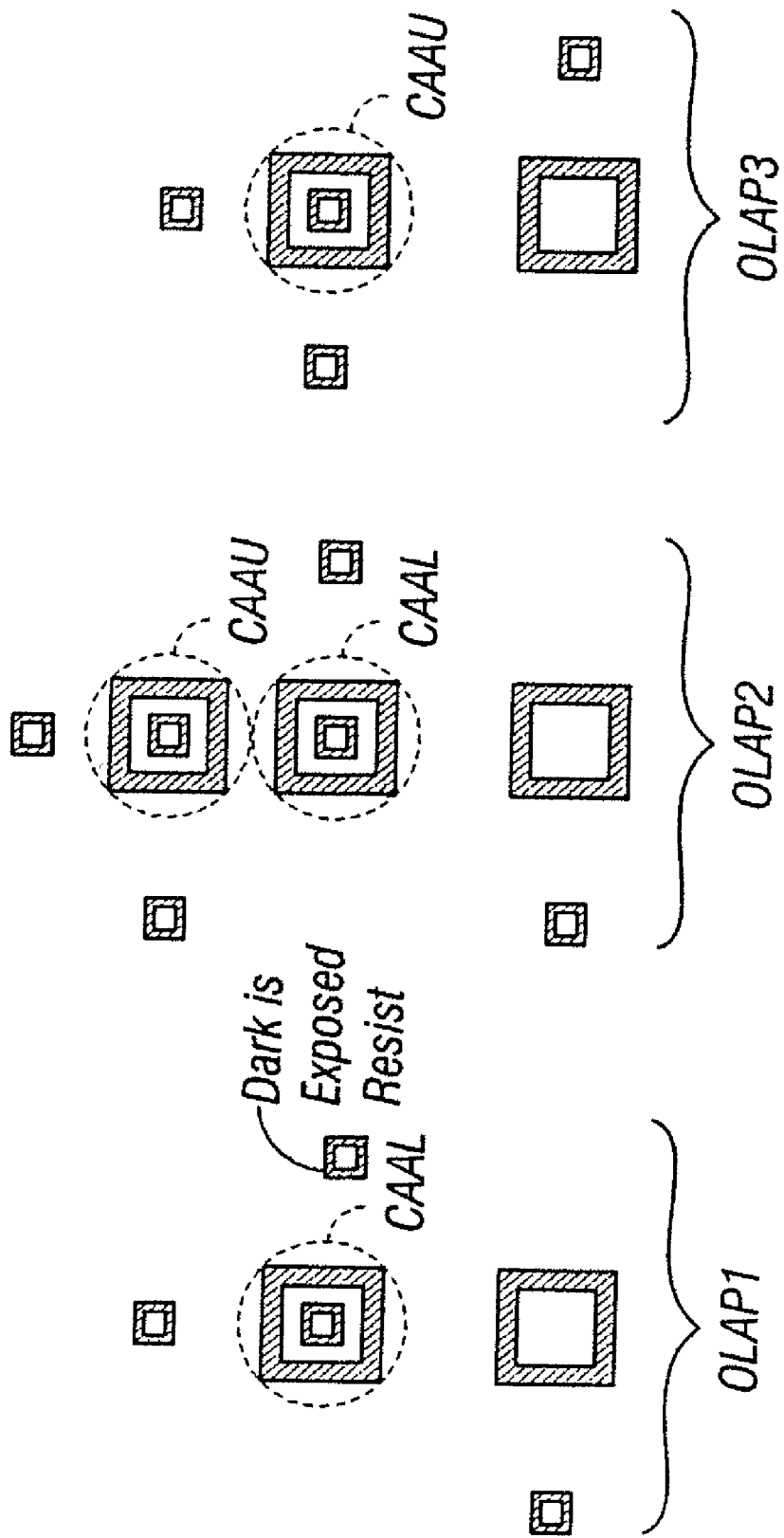
FIG. 34 shows OLAP1, OLAP2, and OLAP3 as realized with overlay group of FIG. 7.

Next the wafer is exposed with the overlay reticle OL one or more times resulting in an Nx×Ny array of projected overlapped overlay groups consisting of one or more of the following types, OLAP1, OLAP2 or OLAP3, See FIGS. 18 and 34). Referring to FIG. 15, field F is shown as a dashed rectangle longer than it is wide and with the scanning direction indicated by an arrow. This is typical of the dimensions of a scanned field since the purpose of the scanning mechanism is to enlarge the projected imaging field by utilizing the mechanical synchronization of the wafer and reticle stage and thereby minimize the area projected by imaging objective. See Optical Lithography—Thirty Years and Three Orders of Magnitude, J. Bruning, SPIE Vol. 3051, 14:27, 1997. Typical maximum scanned field dimensions for semiconductor wafer scanners are 22×32.5, 25×33, 26×33, and 26×34 (SW×L in mm per FIG. 1). Thus for semiconductor wafer scanners, to create completed alignment attributes at all Nx×Ny projected overlay groups two separate scans (with fields R1 and R2 in FIG. 15) are required. While the fields R1 and R2 could be done without any overlay region, OL, the resulting measurement set of completed alignment attributes could only partially determine the dynamic scan error over the entire field. While this can be useful in the case where only a small portion of the entire scanned field is to be analyzed or the projected field of interest is small enough that only a single field, R1, will overlay the field of interest, F, the overlapping 2-field case represents the preferred embodiment. Cases where fewer or more fields are required to overlap F are easily adapted from this embodiment. FIG. 20 explicitly shows which overlay groups in FIG. 18 result from which exposure (first, R1, R2).

When viewed with the notch at nominal or 0 degree orientation, (See FIG. 18), exposure R1 of reticle OL of FIG. 6 consists of an Nx×Ny' array of overlay groups (dashed lines of FIG. 18) placed to form completed alignment attributes, CAAL, when combined with the overlay groups defined by the field F exposure (solid lines of FIG. 18). Ny' is less than Ny allowing R1 to be placed so. If the field F has been exposed with center located at wafer coordinates (xc,yc) then for the reticle layout of FIG. 6, then the center of exposure R1 will be made at exposure coordinates (FIG. 27) (xe,ye)=(yc−p'''*(Ny−Ny')/2−dp, −xc). Exposure coordinates (xe,ye) do not rotate with the wafer but coincide with the wafer coordinates when the wafer has its notch at the 0 degree or nominal orientation. Both wafer and exposure coordinates have the wafer center, WC of FIG. 27, as their origin. So, having completed the R1 exposure, there results an Nx×Ny' array of completed alignment attributes for the lower portion of the field F (CAAL of FIG. 18).

Next, exposure R2 is made covering the upper portion of field F and consisting of an Nx×Ny'' array of overlay groups (dash dot lines of FIG. 18) that are placed to form an Nx×Ny'' array of completed alignment attributes, CAAU, for the upper portion of field F. Ny'' is less than Ny so the CAAU array extends from row b=Ny−Ny''+1 to b=Ny. So that we can diagnose the scan distortion over the entire field F, the lower and upper exposures, R1 and R2, need to overlap at least two overlay groups. Referring to FIG. 18, rows b=Ny−Ny''+1 through b=Ny' will consist of projected overlapped overlay groups OLAP2 each of which consists of completed alignment attributes CAAL and CAAU. In terms of Ny' and Ny'' this means Ny'+Ny''>=Ny+2. With the field F placed at (xc, yc), exposure R2 will be placed at exposure coordinate (xe, ye)=(yc+p'''*(Ny−Ny'')/2+dp, −xc) resulting in the dash dot overlay groups of FIG. 18.

The net result of exposures F, R1 and R2 is to create an Nx×Ny−Ny'' array of projected overlapped overlay groups, OLAP1, each containing at least one completed alignment attribute, CAAL, of fields F and R1. Further, an Nx×Ny'−Ny+Ny'' array of projected overlapped overlay groups, OLAP2, each containing at least one completed alignment attribute, CAAL, of fields F and R1 and at least one completed alignment attribute, CAAU, of fields F and R2. Further, an Nx×Ny−Ny'+1 array of projected overlapped overlay groups, OLAP3, each containing at least one completed alignment attribute, CAAU, of fields F and R2.

Develop Wafer

The wafer is then developed.

Measure Overlay Targets

Next, an overlay metrology tool is used to determine the positional offset error of at least 2 columns of completed alignment attributes. Thus, in the first embodiment, the two outer columns, a=1 and a=Nx of FIG. 18 would be measured. Within each measured column, all completed alignment attributes, Ny' CAAL and Ny'' CAAU, for a total of Ny'+Ny'' would be measured. The effect of not measuring an alignment attribute CAAL or CAAU is that we lose information concerning scanner distortion for that particular row, however we need to measure at least 2 rows where the alignment attributes lie within OLAP2 groups.

Provide Lens Distortion Map

Next, a map of the dynamic lens distortion for the machine being measured is provided. The dynamic lens distortion (eq. 3a) represents the effect of lens aberrations on intrafield distortion. Lens distortion is constant over short time periods (less than about one day) and therefore its contribution can be determined in advance and used for corrections and improvements in accuracy for the present determination of scanning distortion.

There are numerous methods for determining dynamic lens distortion the most accurate of which is the method of Smith, (U.S. Pat. No. 6,906,780). Another technique for the determination of lens distortion is the method of Smith, McArthur, and Hunter (U.S. Pat. No. 6,573,986). This technique can be applied to measure the repeatable part of the scanner distortion along with the lens distortion, the resulting 2-dimensional field fit to the functional form for scanner intra-field distortion (eq. 3g) and the dynamic lens distortion extracted. Yet another technique involves exposing a dynamic field a single time and measuring the absolute positions of the printed features using an absolute position metrology tool such as the LMS IPRO. See Leica LMS IPRO Brochure, supra. Again, the resulting 2-dimensional field fit to the functional form for scanner intra-field distortion (eq. 3g) and the dynamic lens distortion extracted.

In cases where the scanning distortion is large compared to the lens distortion, the contribution from lens distortion can be neglected.

Reconstruct Scanner Distortion Map

Figures 13, 14:
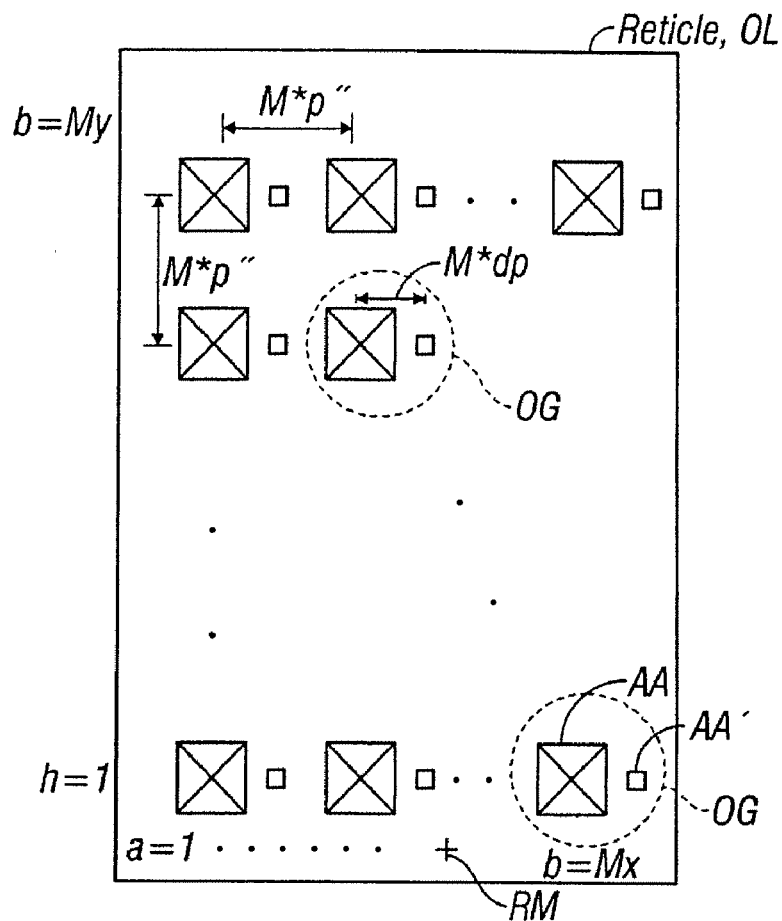
FIG. 13 shows a second embodiment of the preferred reticle.
FIG. 14 shows a data file that represents the final results of the method of this invention.

At this point, a software algorithm is used to calculate the scanner distortion the result being a table, as shown in FIG. 14, consisting of the scanning distortion as a function of the scan (y) position. What follows are details of the software algorithm.

As noted above, Equations 12 and 13 show that the intrafield distortion error in the presence of scanner synchronization error and lens distortion is the sum of two vector parts;

$$\delta X(x,y) = \Delta XS(y) + \Delta xL(x), \qquad \text{eq. 12}$$

$$\delta Y(x,y) = \Delta YS(y) + \Delta yL(x) - \Delta YR(x,y) \qquad \text{eq. 13}$$

Where (x, y) are the intrafield coordinates. They are centered on field F and shown in FIG. 19. Also, $\Delta XS(y)$, $\Delta YS(y)$, represent the integrated average translational error associated with the scanning dynamics, $\Delta xL(x)$, $\Delta yL(x)$, represent the translational error associated with lens distortion and $\Delta YR(x,y)$ represents the integrated scanning average Yaw error ($\Delta YR(x,y) = x^*[d\Delta YS(y)/dx] = x^*[\theta_{avg}(y)]$).

The deviation of the overlay groups in field F from their ideal positions (dxF,dyF)(x,y) is given by:

$$dxF(x,y) = Tx - q^*y + \Delta xL(x) + \Delta XS(y) \qquad \text{eq. 14}$$

$$dyF(x,y) = Ty + q^*x + \Delta yL(x) + \Delta YS(y) + x^*\theta_{avg}(y) \qquad \text{eq. 15}$$

where Tx, Ty, q represent a gross intrafield translation and rotation due to reticle and stage mispositioning.

The deviation of the overlay groups in field R1 from their ideal positions (dxR1,dyR1)(x,y) is given by:

$$dxR1(x,y) = Tx' - q'^*y - \Delta yL(y + n1^*p'') + \Delta YS'(x) + y^*\theta'_{avg}(x) \qquad \text{eq. 16}$$

$$dyR1(x,y) = Ty' + q'^*x + \Delta xL(y + n1^*p'') + \Delta XS'(x) \qquad \text{eq. 17}$$

where n1=when field R1 is centered within the maximum allowed exposure field and Tx', Ty', q' are another set of translations and rotation.

The deviation of the overlay groups in field R2 from their ideal positions (dxR2,dyR2)(x,y) is given by:

$$dxR2(x,y) = Tx'' - q''^*y - \Delta yL(y - n2^*p'') + \Delta YS''(x) + y^*\theta''_{avg}(x) \qquad \text{eq. 18}$$

$$dyR2(x,y) = Ty'' + q''^*x + \Delta xL(y - n2^*p'') + \Delta XS''(x) \qquad \text{eq. 19}$$

where n2=when field R2 is centered within the maximum allowed exposure field and Tx'', Ty'', q'' are yet another set of translations and rotation.

Denoting now the sign of the displacement for the outer box by + and the sign of the inner box by −, the lower completed alignment attributes, CAAL, produce overlay measurements:

$$BBx(x,y;L)=Tx-Tx'+\Delta xL(x)-\Delta YS'(x)+(-q+q'-\theta' \text{avg}(x))$$
$$*y+\Delta yL(y+n1*p'')+\Delta XS(y) \quad \text{eq. 20}$$

$$BBy(x,y;L)=Ty-Ty'+\Delta yL(x)-\Delta XS'(x)+(q-q'+\theta \text{avg}(y))$$
$$*x-\Delta xL(y+n1*p'')+\Delta YS(y) \quad \text{eq. 21}$$

while the upper completed alignment attributes, CAAU, produce overlay measurements:

$$BBx(x,y;U)=Tx-Tx''+\Delta xL(x)-\Delta YS''(x)+(-q+q''-\theta'' \text{avg}(x))*y+\Delta yL(y-n2*p'')+\Delta XS(y) \quad \text{eq. 22}$$

$$BBy(x,y;U)=Ty-Ty''+\Delta yL(x)-\Delta XS''(x)+(q-q''+\theta \text{avg}(y))$$
$$*x-\Delta xL(y-n2*p'')+\Delta YS(y) \quad \text{eq. 23}.$$

In the region where R1 and R2 overlap the projected overlay groups, OLAP2, contain both an upper, CAAU, and lower, CAAL, completed alignment attribute. The difference between the upper and lower overlay measurements at the same position and putting the known lens distortions on the left hand side gives:

$$BBx(x,y;U)-BBx(x,y;L)-\Delta yL(y-n2*p'')-\Delta yL(y+n1*p'')=Tx''+Tx'-\Delta YS''(x)+\Delta YS'(x)+(q''-q'-\theta'' \text{avg}(x)+\theta' \text{avg}(x))*y \quad \text{eq. 24}$$

$$BBy(x,y;U)-BBy(x,y;L)-\Delta yL(y-n2*p'')-\Delta yL(y+n1*p'')=-Ty''+Tx'-\Delta XS''(x)+\Delta XS'(x)+(-q''+q')*y \quad \text{eq. 25}$$

The interpretation of Equations 24 and 25 is that we know what the translation and rotation of each column in the upper section relative to the lower section and that therefore, by applying Equations 24 and 25 at 2 or more points in y along each column, we can fix the location of the lower set of completed alignment attributes, CAAL, to the upper section of completed alignment attributes, CAAU.

Further interpreting Equations 20-23, considering a specific column or fixed x value, since the uncertainty or unknown part of the lens distortion will typically consist of a translation, rotation and x-scale. Based on these unknown quantities, and utilizing data from 2 distinct columns (y values) of field F, we will be able to determine $\Delta XS(y)$ to within an expression of the form $a+b*y$, $\theta \text{avg}(y)$ to within a constant d, and $\Delta YS(y)$ to within a constant c. Taken altogether, we will be able to determine the scanner distortion ($\Delta XS(y)$, $\Delta YS(y)+\theta \text{avg}(y)*x$) to within an expression of the form $(a+b*y,c+d*x)$ where a, b, c, d are unknown constants. In other words, we will know the scanning distortion to within a translation, rotation and skew (b term).

Equations 20-23 are typically solved using the singular value decomposition to produce the minimum length solution. See Numerical Recipes, The Art of Scientific Computing, W. Press et al., Cambridge University Press, 52:64, 1900. They are typically over-determined in the sense of equation counting (there are more equations than unknowns) but are still singular in the mathematical sense; there is an ambiguity in the solution of these equations. This ambiguity in the four parameter set discussed above for the wafer stage can also induce intrafield rotation errors.

At this point we have accomplished the last step in the process of this invention and we can record the final results of the scanning distortion in tabular form (FIG. 14).

Second Embodiment

Figure 21:
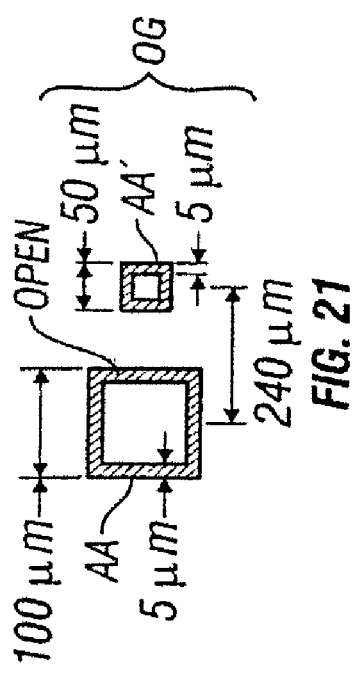
FIG. 21 shows an example of a minimal overlay group as realized on a dark field reticle for carrying out the method of this invention.
Figure 22:
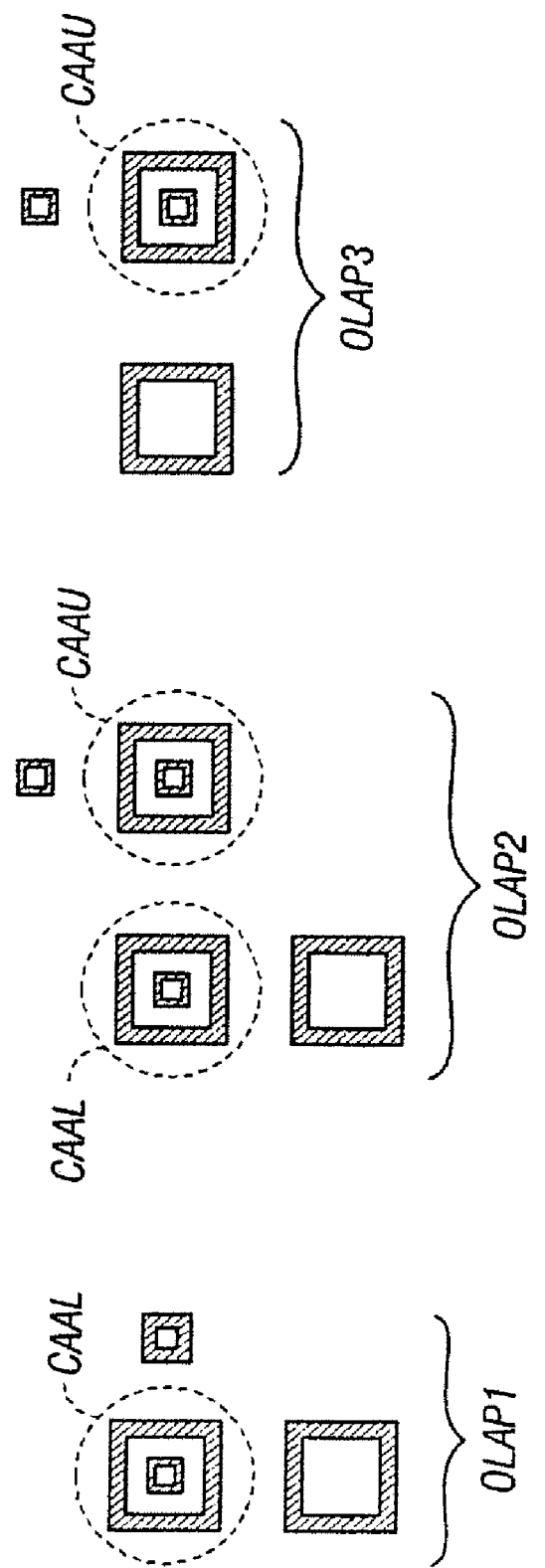
FIG. 22 shows overlapped overlay groups OLAP1, OLAP2, OLAP3 as realized with the overlay group of FIG. 21.

Instead of the reticle of FIG. 6, this invention could be carried out with the reticle layout of FIG. 13. It too consists of an Mx×My array of overlay groups OG on regular pitch M*p" the only difference being in the details of the overlay group. Now overlay group OG consists of alignment attribute AA and only a single complementary alignment attribute, AA', offset from it in a single direction. An example of an overlay group with this structure is shown in FIG. 21. There a dark field reticle design consists of outer bar alignment attribute AA and the complementary alignment attribute consists of an inner bar alignment attribute AA'. Reticle dimensions suitable for an M=4 or 5 reduction imaging lithography tool are shown. FIG. 22 shows how projected overlapped overlay groups OLAP1, OLAP2 and OLAP of FIG. 18 would appear when the overlay group of FIG. 21 is utilized. Lower, CAAL, and upper, CAAU, completed alignment attributes are also indicated. The dark areas correspond to exposed resist. Other than the appearance of the overlay groups, this reticle would be used in the same way as the reticle mentioned in the preferred embodiment.

Third Embodiment

In this case, the overlay groups OG of reticle OL (FIG. 6) consist of a pair of wafer alignment marks. Referring to FIG. 23, overlay group OG consists of alignment attribute AA and offset from it is complementary alignment attribute AA'. AA is a wafer alignment mark, WAM0, suitable for use by a lithography tool wafer alignment system and stage when the wafer is in the nominal or 0 degree position. AA' is a wafer alignment mark, WAM90, which is wafer alignment mark WAM0 rotated by 90 degrees in a clockwise direction. FIG. 24 shows how projected overlapped overlay groups OLAP1, OLAP2 and OLAP of FIG. 18 would appear when the overlay group of FIG. 23 is utilized. Lower, CAAL, and upper, CAAU, completed alignment attributes are also indicated. The exposure steps of the preferred embodiment must be altered is an obvious way so the wafer pattern results in the projected overlapped overlay groups OLAP1, OLAP2 and OLAP of FIG. 24. The other step that differs in detail is that of measuring the overlay targets. In this instance, instead of using an optical overlay metrology tool, the lithography tool wafer stage and alignment system is used. The completed alignment attribute is a pair of wafer alignment marks (FIG. 3 and CAAL, CAAU of FIG. 24) and the lithography system measures the offset of the two alignment marks AA' and AA and the nominal offset, (D,0), is subtracted from this resulting in the required overlay measurement. The nominal offset, (D,0), is determined by the details of the exposure plan and the minimum separation requirements of the wafer alignment system. Typically, D is less than about 0.5-1 mm so that the wafer stage is utilized over extremely small distances where it's accuracy will be greatest. So, when referring to overlay metrology tools, we also encompass absolute positioning metrology tools used over small (<4 mm) distances. Wafer alignment mark WAM need not be the same wafer alignment mark as the machine we are measuring, it could be another absolute positioning metrology tool. This embodiment is useful for embedding the entire procedure and technique of this invention into a lithography tool for self-analysis.

Fourth Embodiment

In this case, the overlay groups OG of reticle OL (FIG. 6) consists of a single wafer alignment mark. Referring to FIG. 25, overlay group OG consists of alignment attribute AA which is complementary to itself when rotated by 90 degrees. WAM is a wafer alignment mark suitable for use by a lithography tool wafer alignment system. FIG. 26 shows how projected overlapped overlay groups OLAP1, OLAP2 and OLAP of FIG. 18 would appear when the overlay group of FIG. 25 is utilized. Lower, CAAL, and upper, CAAU, completed alignment attributes are also indicated. The exposure steps of the preferred embodiment must be altered is an obvious way so the wafer pattern results in the projected overlapped overlay groups OLAP1, OLAP2 and OLAP of FIG. 26. The detailed method and description of measuring the completed alignment attributes is as described in the third embodiment. This embodiment is extremely useful when the procedure and technique is embedded into the projection imaging tool for use in self-analysis.

Fifth Embodiment

FIG. 28 shows a fifth embodiment of this invention. When it is desired to measure the repeatable part of the dynamic scan distortion with a minimum number of overlay measurements, the two reticles are used. The first reticle, OL, is the one already described above. The second reticle, OL', is the reticle of FIG. 6 as modified with the addition of a partially reflecting coating, PR, to the surface opposite the patterned chrome surface (FIG. 28). There, partially reflecting coating PR will typically reflect 50% to 99% of the incident light used for resist exposure while patterned chrome surface, PS, contains overlay groups OG. Thus, overlay reticle OL' is a reduced transmission reticle, meaning it's transmission is less than that of a normal reticle. In operation, the step of "Expose Reticle" which produces field F of FIG. 17 is carried out with reticle OL'. Now instead of a single exposure, because of the reduced net reticle transmission (as produced by partially reflecting coating PR), multiple exposures are made so the resist receives the correct clearing dose. The effect of doing N exposures to make field F is that the non-repeatable part of the dynamic scan distortion is averaged over a number of exposures proportional to N thereby reducing its contribution to the net dynamic scan distortion. After the "Expose Reticle" step has been carried out, the remaining steps, as previously described, are carried out. In particular, the step of "Expose OL Reticle to Create Completed Alignment Attributes" is carried out using ordinary reticle OL.

Sixth Embodiment

FIG. 29 shows a sixth embodiment of this invention. This is another specific variation of the reduced transmission reticle, OL', of the fifth embodiment only now instead of having a partially reflecting coating on the back side, the patterned face that contains the overlay groups, OG, is patterned as an attenuated phase shift mask. See The Attenuated Phase Shift Mask, B. Lin, Solid State Technology, Special Series/Advanced Lithography, 35(1):43-47, (January, 1992). The overlay groups are patterned using only the attenuated phase shifting material. It is not the phase shifting property of this layer that is significant only its transmission characteristics which are typically less than about 10%. In all other respects, this embodiment is identical to the fifth embodiment.

Seventh Embodiment

FIG. 30 shows a seventh embodiment of this invention. Here instead of reticle OL of FIG. 6 being a transmissive reticle it is a reflective reticle. In a dark field version of this (FIG. 30) the overlay groups are defined by the presence of a reflective layer on the mask.

Exposure Averaging Embodiments

Exposure averaging embodiments, such as using reduced transmission reticles or other techniques for reducing the dose of exposure and carrying out multiple exposures, can be useful in reducing the effects of random errors in a stepped reference pattern. As noted, the stage metered lens distortion technique is the standard industry technique for determining intra-field distortion (lens, or combined lens and scan). This technique inherently includes effects of the wafer stage grid and yaw error due to stepping the reference pattern across the full field exposure. The non-repeatable parts of wafer stage grid and yaw can be reduced by averaging over multiple tests of this type. In the case of a scanner, there is inherent intra-field variability due to scanning synchronization error varying on a scan by scan basis so in this case, it is typical to require averaging over even more fields to average out both the stepped reference pattern and the scan to scan intra-field variability when it is desired to extract average scan behavior.

Figure 35:
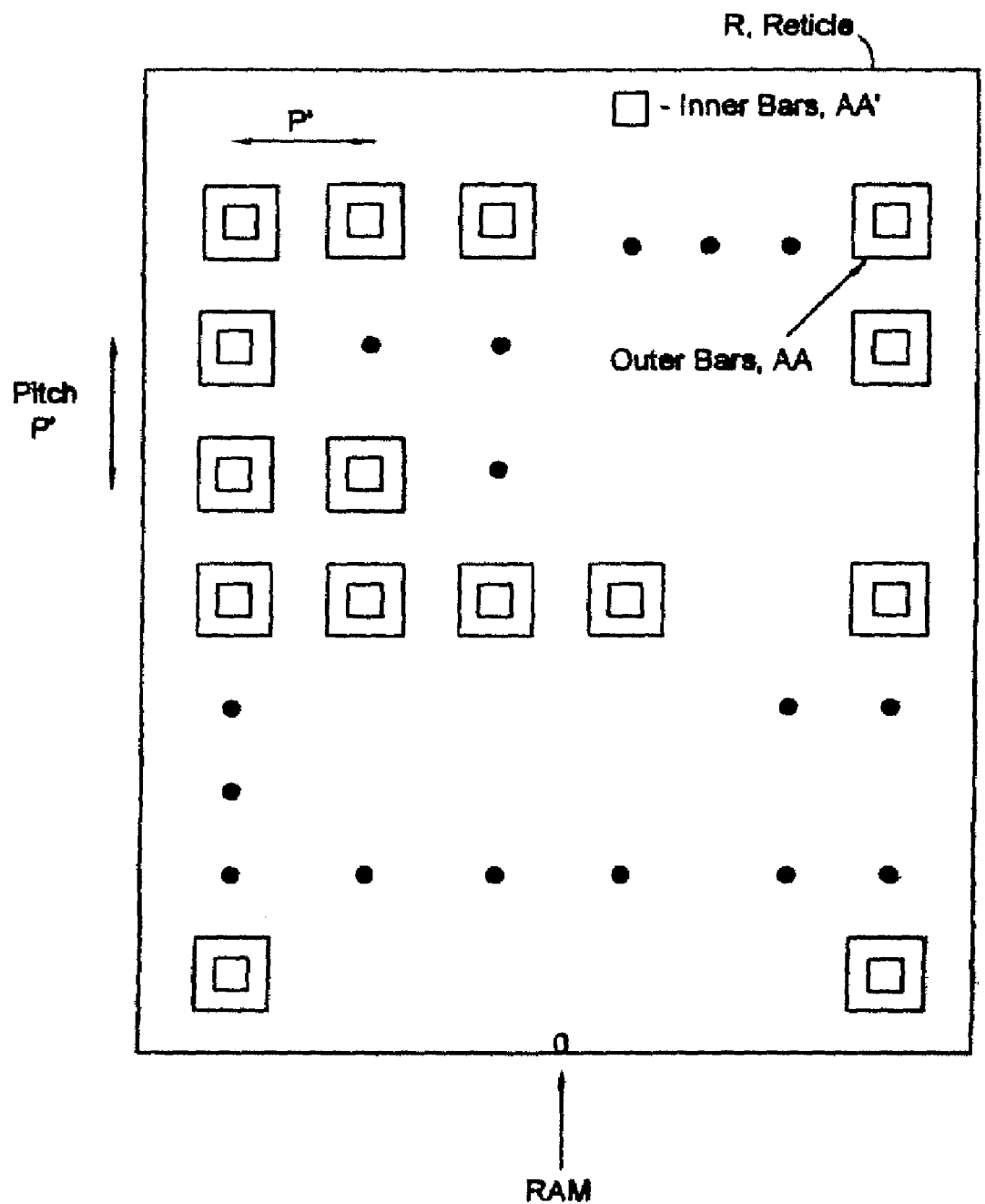
FIG. 35 is a representation of a reticle R that includes an NX×NY array of alignment attributes.
Figure 36:
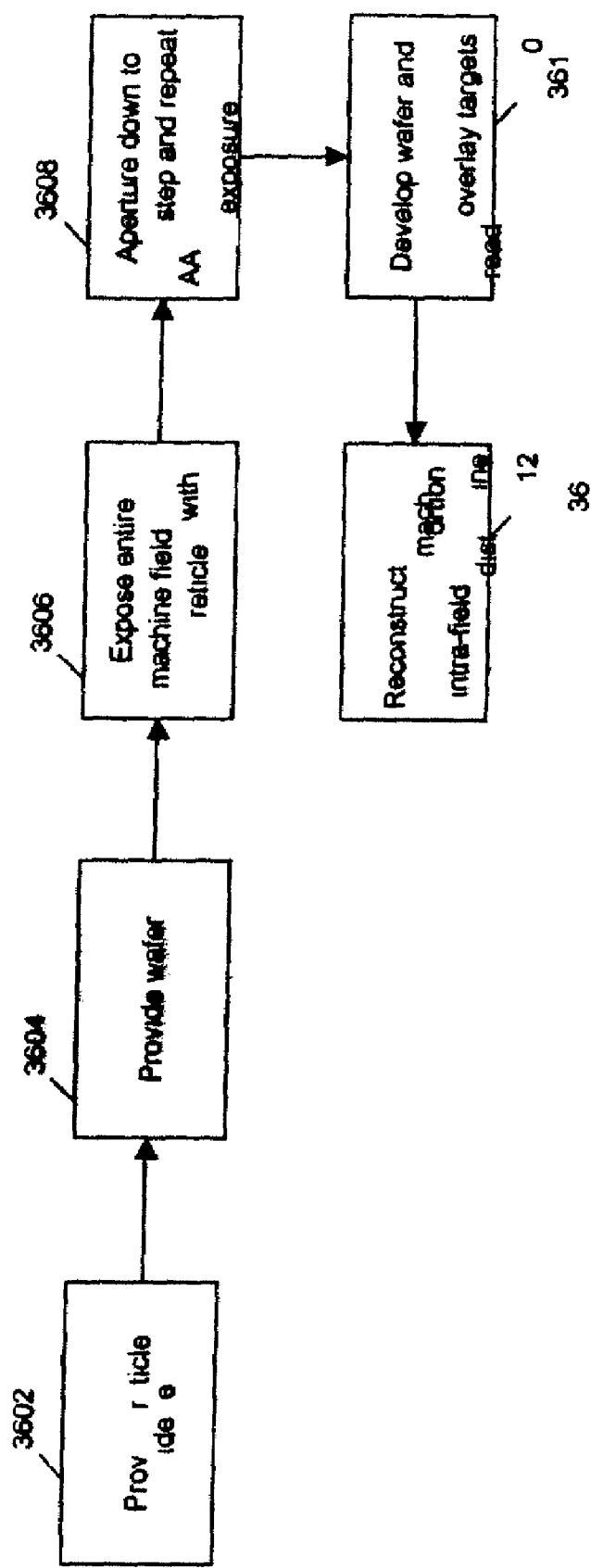
FIG. 36 is a flow diagram illustrating a technique for stage metered intra-field distortion measurements.
Figure 37:
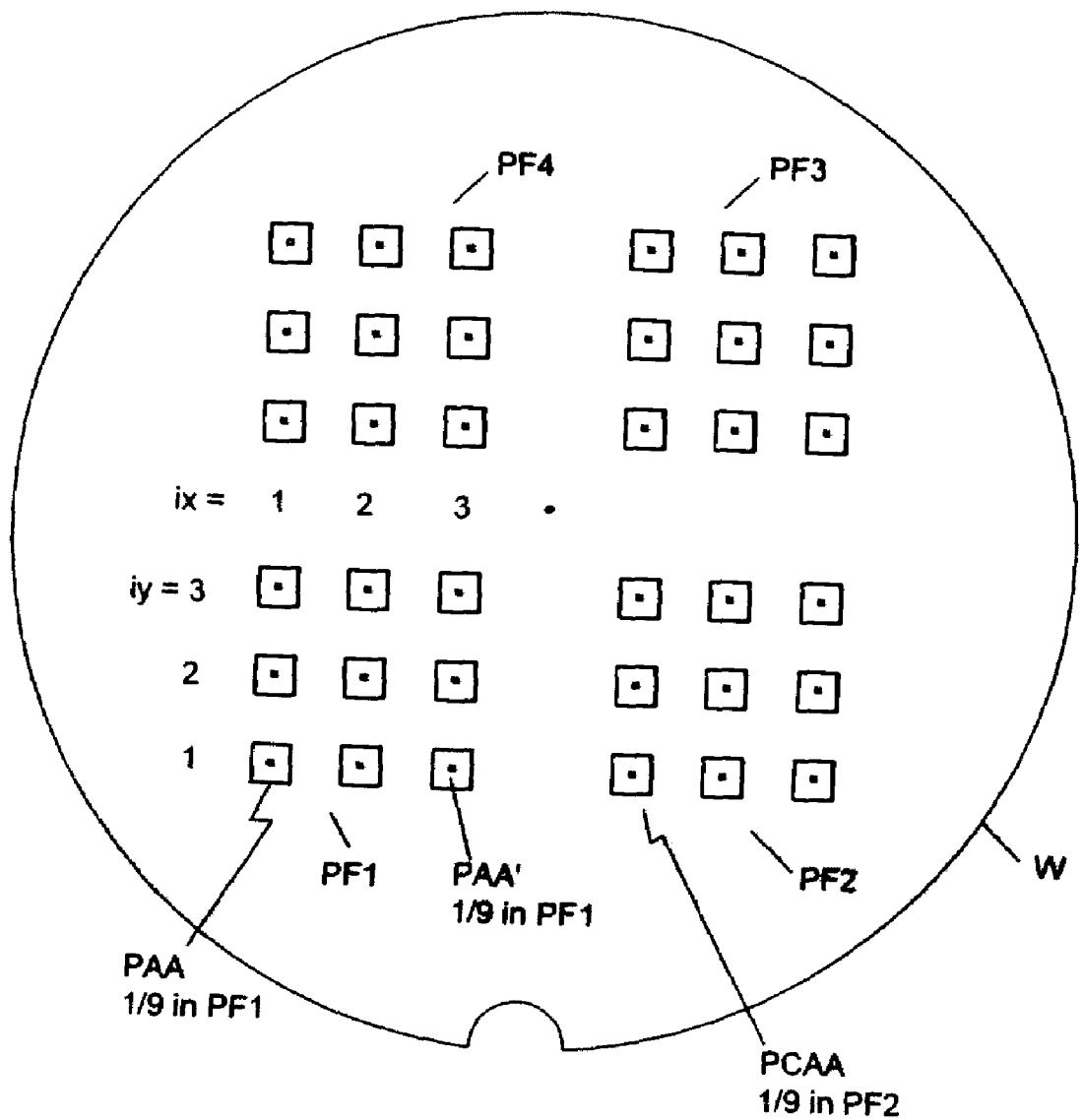
FIG. 37 is a schematic diagram of a wafer exposed multiple times in accordance with the process described in FIG. 36.

FIGS. 35, 36, and 37 illustrate aspects of the stage metered intra-field distortion measurement technique. FIG. 35 is a representation of a reticle R that includes an NX×NY array of alignment attributes, AA. The reticle R also includes a single complementary alignment attribute AA' toward the top of edge of FIG. 35. In the example illustrated in FIG. 35, the alignment attributes AA are outer bars, or outer boxes, and the complementary alignment attribute AA' is an inner bar pattern, or an inner box.

FIG. 36 is a flow diagram illustrating a technique for performing stage metered intra-field distortion measurements. Flow begins in block 3602 where a reticle is provided. Flow continues to block 3604 where a photo resist wafer is provided. Flow continues to block 3606. In block 3606 the entire projection field of the projection imaging tool, or machine, is exposed onto the wafer stage with the reticle. Flow continues to block 3608. In block 3608 image field blades are used to decrease the aperture so that only the complementary alignment attribute, AA', will be exposed. The wafer stage is then stepped so that the complementary alignment attribute is exposed so that it is interlocked with the alignment attributes that were previously exposed, thereby forming completed alignment attributes. Exposure of the complementary alignment attribute is repeated across the wafer stage until all, or a desired number, of completed alignment attributes are formed. Flow continues to block 3610 and the wafer is developed and measurements made of the completed alignment attributes, or overlay targets. Flow then continues to block 3612 and the intra-field distortion of the projection imaging tool, or machine, is reconstructed.

FIG. 37 is a schematic diagram of a wafer that has been exposed multiple times in accordance with the process described in FIG. 36. In the example of FIG. 37, the entire field of the reticle R has been exposed four times resulting in four printed fields PF1-PF4. In this example, each printed field PF1-PF4 is a 3×3 array of printed alignment attributes PAA. After the printed fields were exposed the reticle R was apertured down so only complementary alignment attribute AA' could be exposed and the wafer stage was stepped around the area of each printed field nine times to create nine printed complementary alignment attributes, PAA'. The superposition of printed alignment attributes and printed complementary alignment attributes results in a printed completed alignment attribute, PCAA, which can be read with an overlay reader which measures an offset of a PAA' from its corresponding PAA. The resulting measurements are:

(BBX,BBY)(ipf;X(ix),Y(iy))=overlay measurement of printed field number ipf at intra-field position (X(ix),Y(iy))     (eq. 26)

An average of the overlay measurements over printed fields may be calculated:

(BBXavg,BBYavg)(X(ix),Y(iy))=average over printed fields (ipf) of (BBX,BBY)(ipf;X(ix),Y(iy))     (eq. 27)

The intra-field distortion map can then be determined from these averaged measurements:

(TX_if,Ty_if)(X(ix),Y(iy))=(BBXavg,BBYavg)(X(ix),Y(iy))     (eq. 28)

First Exposure Averaging Embodiment

Figure 38:
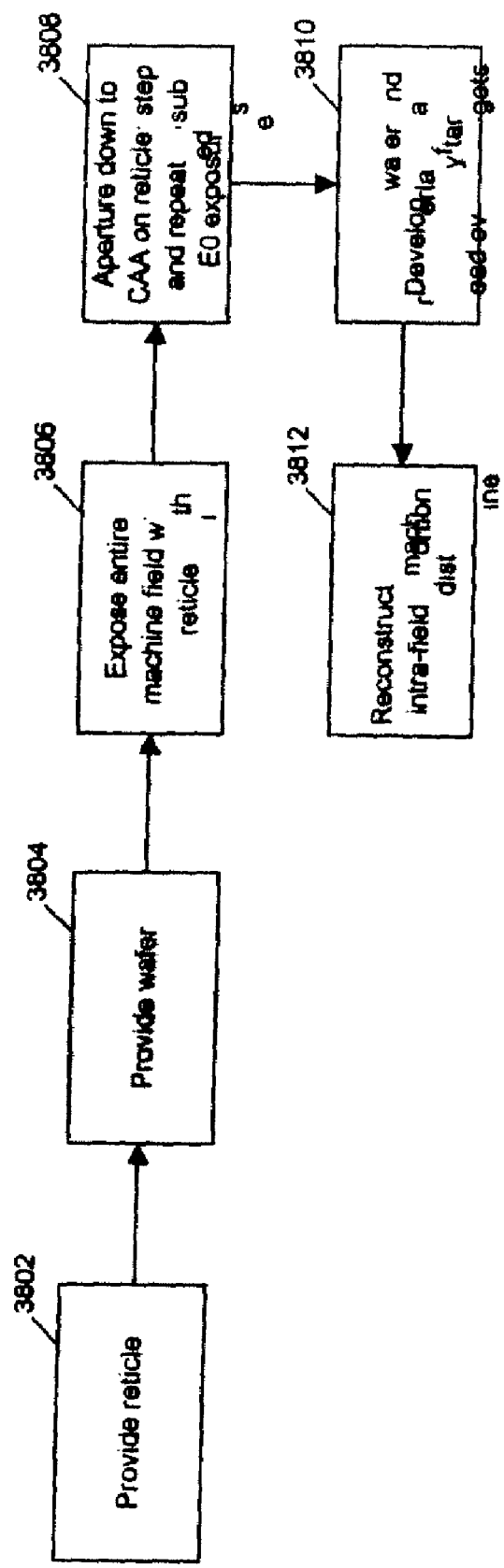
FIG. 38 is a flow diagram illustrating an improved technique for determining intra-field distortion.

FIG. 38 is a flow diagram illustrating an improved technique for determining intra-field distortion. Techniques illustrated in FIG. 38 reduce the effects of random error in the stepped reference pattern and provide the ability to measure the average intra-field scan distortion with fewer measurements. Flow begins in block 3802 where a reticle is provided. The reticle may be loaded onto a reticle stage of a projection imaging tool, or machine. Flow then continues to block 3804 and a photo resist coated wafer is provided. The wafer may be loaded onto a wafer stage of a projection imaging tool. Flow continues to block 3806.

Figure 39:
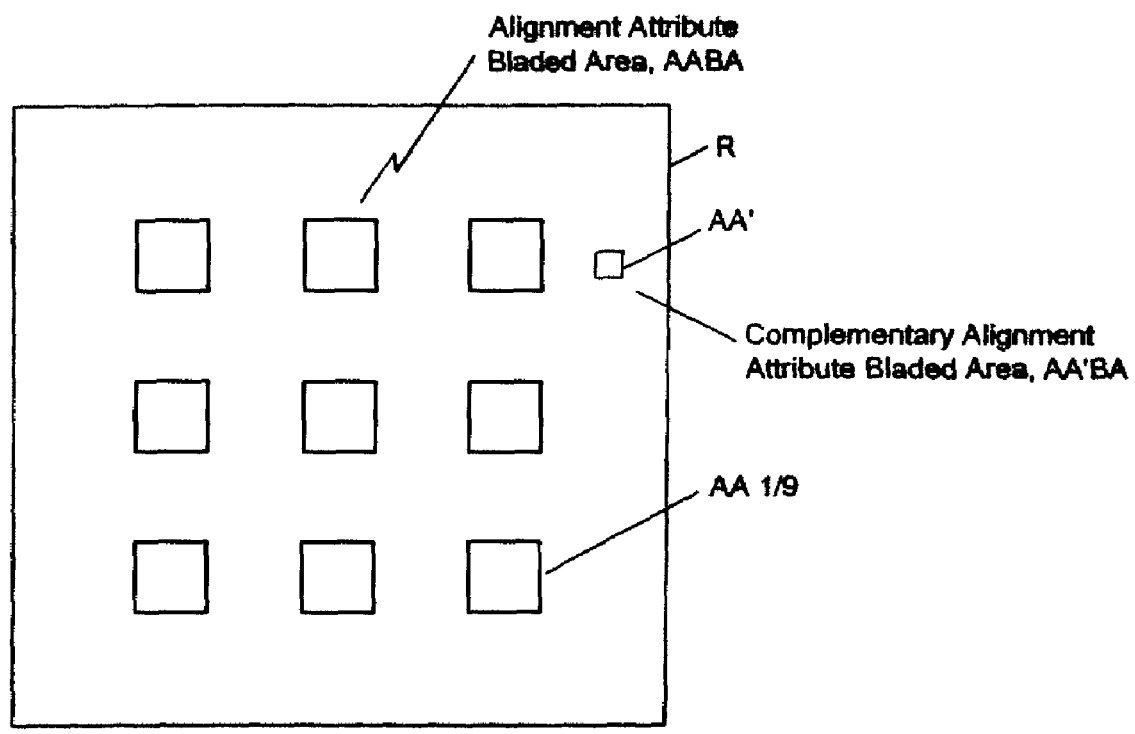
FIG. 39 is a block diagram of a reticle illustrating the bladed areas on a reticle.

In block 3806, image field blades in the projection imaging system are apertured down on the reticle to an area corresponding to the projected field of the projection imaging tool. For example, a typical projection imaging tool may be a 5× reduction stepper. In this example, the bladed area on the reticle would correspond to a 22×22 mm² projected field on wafer W while in a typical 4× reduction scanner, it would be a 26×32 mm² projected field. FIG. 39 is a block diagram of a reticle illustrating the bladed areas on a reticle. As shown in FIG. 39, a reticle R includes an array of alignment attributes AA and a single complementary alignment attribute AA'. Field blades may be used to reduce the aperture, referred to as alignment attribute bladed area AABA, so that only the alignment attributes will be exposed. Also shown in FIG. 39 is the use of field blades to reduce the aperture, referred to as complementary alignment attribute bladed area AA'BA, so that only the complementary alignment attribute will be exposed.

Returning to FIG. 38, in block 3806 field blades are positioned such that the alignment attribute bladed area is exposed with a single pass at a dose greater than what is referred to as E0 (typically approximately 2*E0). "E0" is the dose (in millijoules/cm²) on the wafer required for the subsequent development step to clear a large feature, much greater than the resolution of the projection imaging tool, on the wafer. After exposure, the alignment attributes, AA, of the reticle R will have been printed on the wafer W, thereby forming printed alignment attributes, PAA, of a single printed field, such as PF1 in FIG. 37.

Flow then continues to block 3808. In block 3808, image field blades are now apertured down so that only the complementary alignment attribute, AA', on reticle R will be exposed (AA'BA in FIG. 39). The complementary alignment attribute is exposed in accordance with the operations depicted in FIG. 40.

Figure 40:
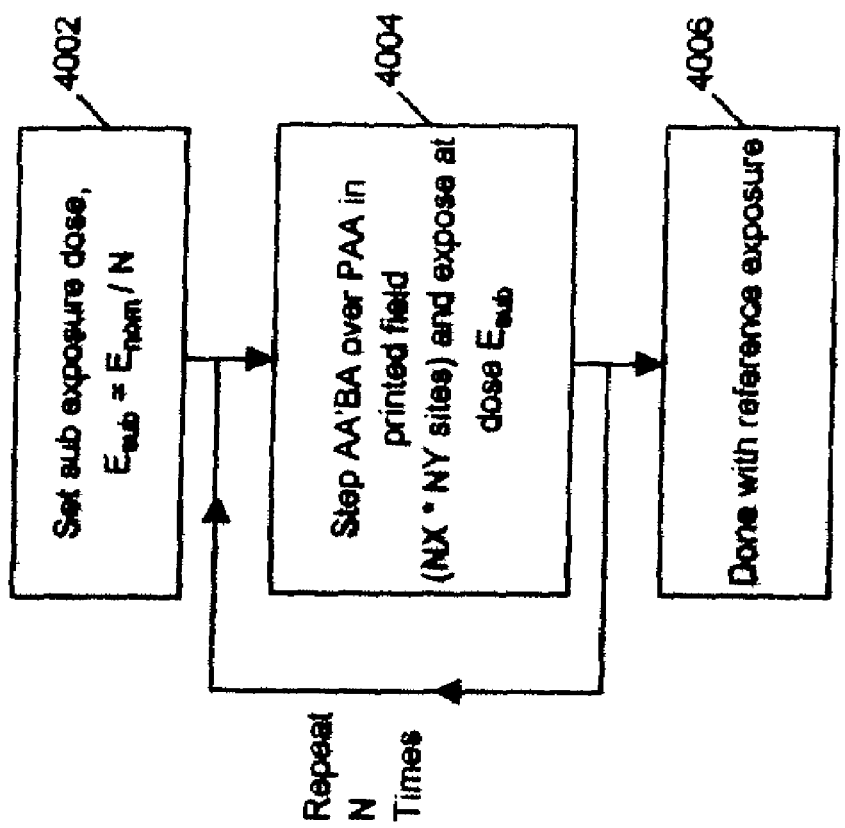
FIG. 40 is a flow diagram illustrating a technique where a series of sub E0 exposures are used to fully expose a complementary alignment attribute.

FIG. 40 is a flow diagram illustrating a technique where a series of sub nominal, or sub E0, exposures are used to fully expose a complementary alignment attribute. It is a further breakdown of block 3808. Flow begins in block 4002. In block 4002, a nominal dose ($E_{nom}$ approximately equal to 2*E0) that is required to fully expose a reticle pattern onto a photo resist coated wafer is reduced, for example divided into a reasonably large (N larger than about 10) number of sub exposures, to arrive at the exposure dose for the complementary alignment attribute AA', such that $$E_{sub} = \frac{E_{nom}}{N}.$$

Flow continues to block 4004 where the complementary alignment attribute, area AA'BA in FIG. 39, is stepped over each PAA in a printed field, such as PF1 in FIG. 37, and exposed with dose Esub. Step 4004 is repeated until the complementary alignment attribute is fully exposed at each of the PAAs. For example, each PAA in FIG. 37 includes an NX by NY array of alignment attributes exposed. In the example of FIG. 37, ix=1:NX=1:3 and iy=1:NY=1:3 resulting in an array of 9 PAA within each printed field. Each of the PAAs is stepped over N times so that the total dose used to expose the complementary attribute equals a nominal dose. For example, if N=10 then the process in block 4004, where the complementary alignment attribute is exposed onto each PAA within the printed field, is repeated 10 times. In other words, if N=10 and there are 9 PPAs, the complementary alignment attribute would be exposed a total of 90 times. Flow continues to block 4006 and the exposure is complete.

The process described in FIG. 40 results is a printed field (PF1) containing an array of printed completed alignment attributes (PCAA). Using N separate sub E0 exposure steps to fully expose the complementary alignment attribute tends to average out the effects of wafer stage grid and yaw non-repeatabilites. In addition, the advantage of this averaging effect is embodied in a single printed field (PF1) thereby eliminating the need to measure multiple printed fields and then average the resulting measurements. The sub E0 dose may be achieved in different ways. For example, a reduced transmission reticle may be used, or a transmission reducing element may be located within the optics of the projection imaging system, or other techniques.

Returning to FIG. 38, after the repeated sub E0 exposures, flow continues to block 3810. In block 3810, the exposed wafer is developed and the overlay targets in printed field PF1 are read, or measured, in an overlay metrology tool.

Flow continues to block 3812. In block 3812 the projection imaging tool, or machine, intra-field distortion is reconstructed. The overlay measurements can be equated with the intrafield machine distortion as:

(Tx_if,Ty_if)(X(ix),Y(iy))=(BBX,BBY)(ipf=1;X(ix),Y(iy))     (eq. 29)

Comparing Equations 28 and 29 shows that use of the techniques illustrated in FIG. 38 have determined the intrafield distortion map without the need of averaging overlay measurements over multiple printed fields. An advantage of this technique of using N sub exposures to fully expose the complementary alignment attribute is that it has resulted in a decreased number of overlay measurements required to achieve the same noise level by a substantial factor of $$\sim N * \frac{E0}{E_{nom}} > \sim 5.$$

Second Exposure Averaging Embodiment

Figure 41:
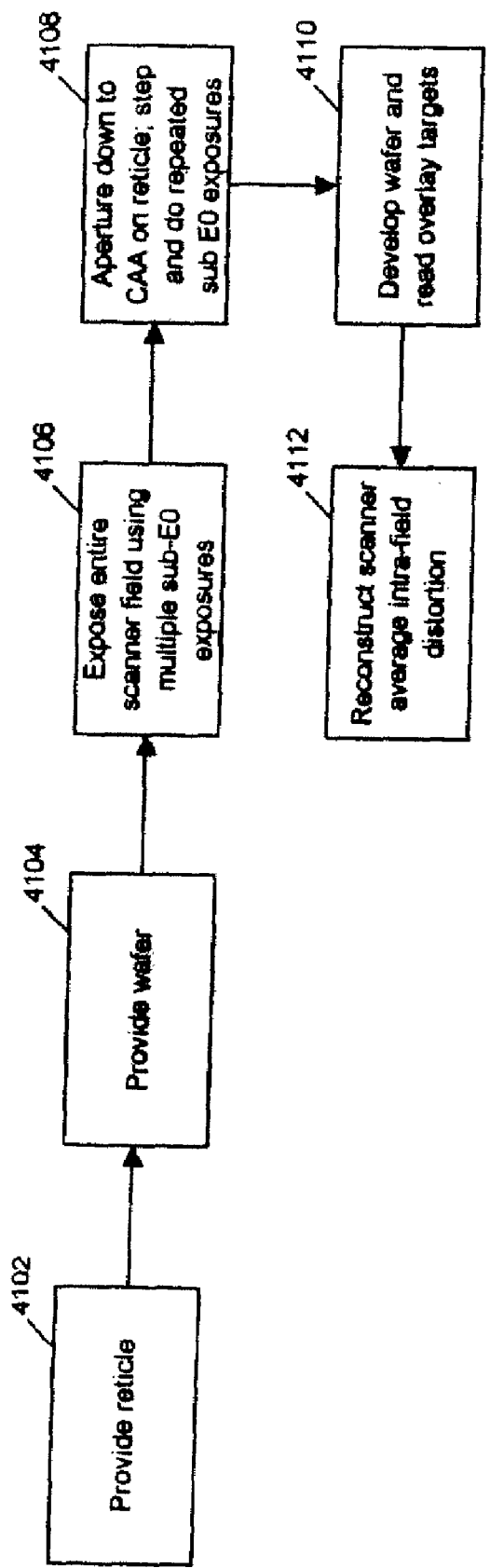
FIG. 41 is a flow diagram illustrating another embodiment of techniques for reducing noise in measurements for determining intra field distortion.

FIG. 41 is a flow diagram illustrating another embodiment of techniques for reducing noise in measurements for determining intra field distortion. This technique applies to step and scan systems (scanners). Flow begins in block 4102 where a reticle is provided similarly to block 3802 in FIG. 38. Flow continues to block 4104 where a wafer is provided similarly to block 3804 in FIG. 38. Flow continues to block 4106.

In block 4106, image field blades in the scanner are apertured down on reticle R to an area corresponding to the projected field of the projection imaging tool, similarly to the techniques described above for a scanner. In block 4106 the entire scanner field is exposed using multiple sub nominal, or sub E0 exposures. Details of block 4106 are illustrated in FIG. 42.

Figure 42:
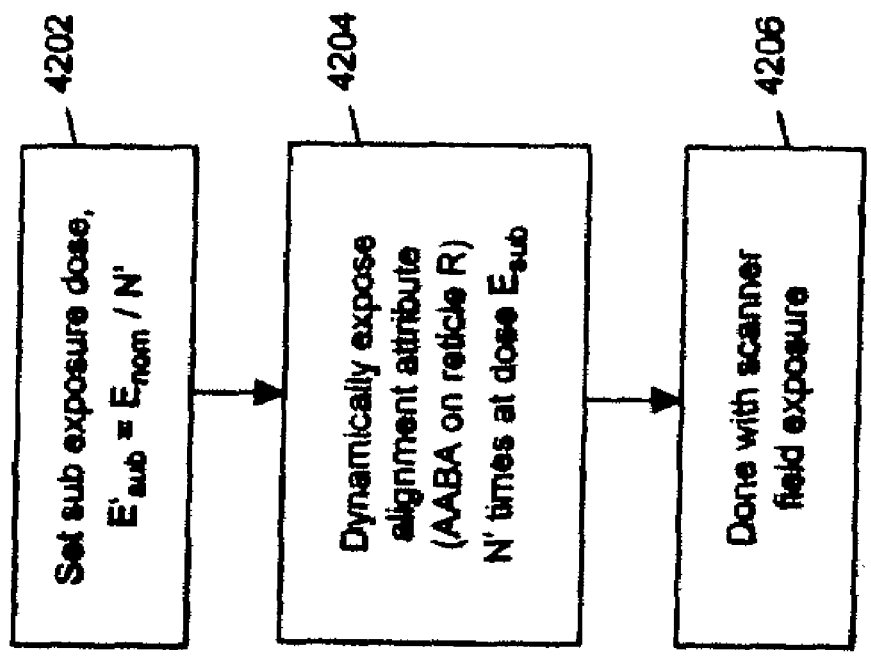
FIG. 42 is a flow diagram illustrating techniques for using multiple sub E0 doses to expose the entire scanner field.

FIG. 42 is a flow diagram illustrating techniques for using multiple sub E0 doses to expose the entire scanner field. Flow begins in block 4202. In block 4202 a nominal dose ($E_{nom}$ approximately equal to 2*E0) that is required to fully expose a reticle pattern onto a photo resist coated wafer is reduced, for example divided into a reasonably large (N' larger than about 10) number of sub exposures, to arrive at the exposure dose for the alignment attributes AA, such that $$E'_{sub} = \frac{E_{nom}}{N'}.$$

Flow continues to block 4204 where the alignment attribute bladed area AABA (see FIG. 39) is dynamically scanned N' times at dose $E'_{sub}$. An advantage of using multiple exposures is that it tends to average out the scanning synchronization error so that subsequent overlay measurements reflect the repeatable part of the scanner synchronization error as much as possible. Flow continues to block 4206 where the alignment attributes, AA, of the reticle R have been printed on the wafer W thereby forming the printed alignment attributes, PAA, of a single printed field (see PF1 in FIG. 37).

Returning to FIG. 41, flow continues to block 4108. In block 4108, the complementary alignment attribute is exposed using multiple sub E0 exposures as described in the discussion of FIG. 38, block 3808 and FIG. 40. Flow then continues to block 4110. In block 4110, the exposed wafer is developed and the overlay targets in printed field PF1 are read, or measured, in an overlay metrology tool. Flow continues to block 4112 and the projection imaging tool, or machine, intra-field distortion is reconstructed.

Third Exposure Averaging Embodiment

Figure 43:
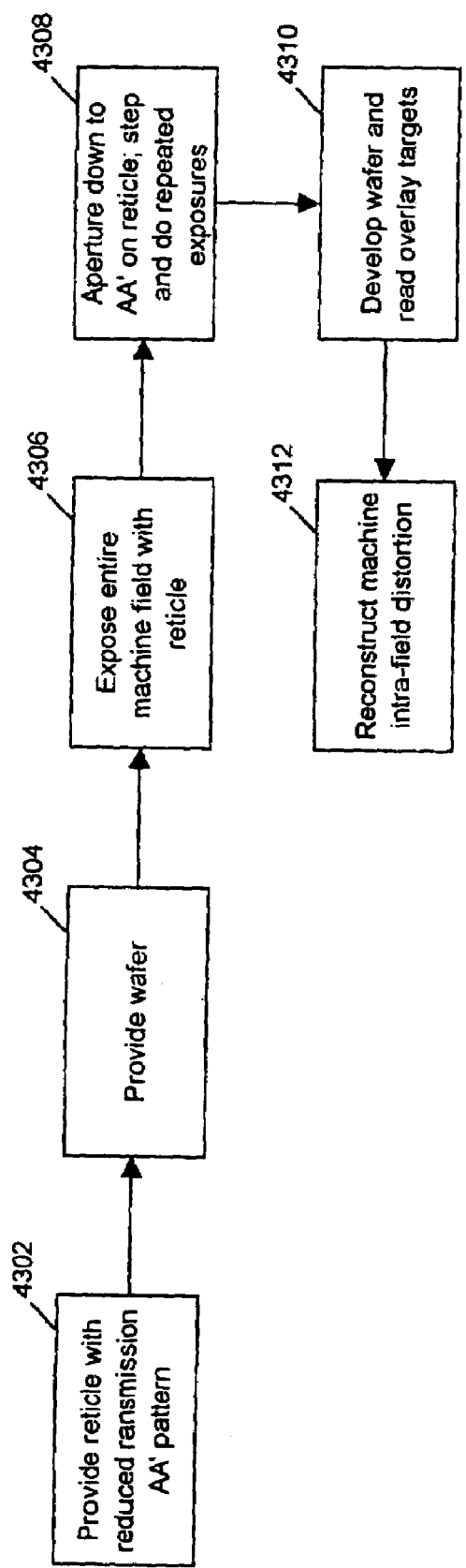
FIG. 43 is a flow chart illustrating another technique for reducing noise in measurements used for determining intra field distortion.
Figure 44:
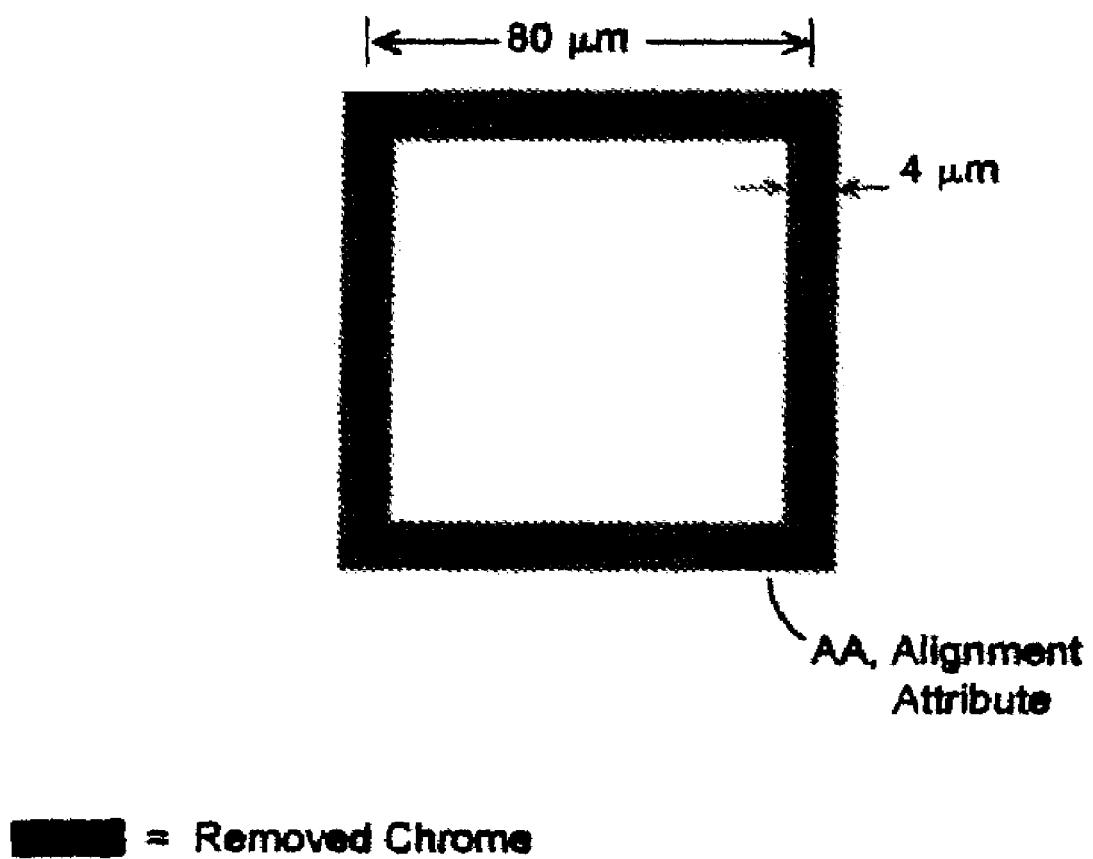
FIG. 44 is a block diagram illustrating alignment attributes AA that are open bars in chrome.
Figure 45:
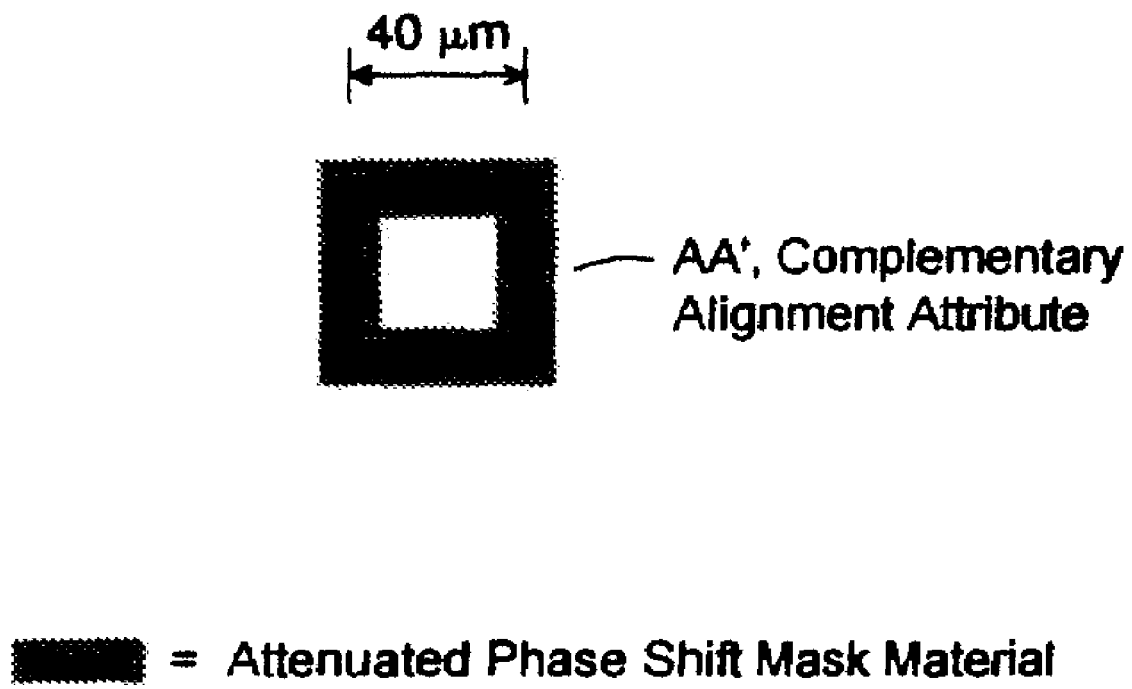
FIG. 45 is a block diagram illustrating an example of a complementary alignment attribute.

FIG. 43 is a flowchart illustrating another technique for reducing noise in measurements used for determining intra field distortion. Flow begins in block 4302 where a reticle is provided. In this embodiment the reticle is configured so that the transmission of the complementary attribute is reduced compared to a standard binary, such as chrome on glass, reticle. For example, light throughput through the portion of the reticle that has not had its transmission reduced may be characterized by a transmissivity of $T_{nom}$=92% and the portion to the reticle that has its transmission reduced may be characterized by a transmissivity of $T'_{nom}$=6%. In this example, the portion of the reticle corresponding to the alignment attributes may have a transmissivity of $T'_{nom}$=92% and the portion of the reticle corresponding to the complementary alignment attribute may have a transmissivity of $T_{nom}$=6%. FIG. 44 is a schematic diagram illustrating alignment attributes AA that are open bars in chrome. In FIG. 44, where the chrome has been removed, indicated by the darkened region, there is clear glass so the transmissivity in this region would be a high value, such as 92%. FIG. 45 is a schematic diagram illustrating an example of a complementary alignment attribute. In FIG. 45, where the chrome has been removed, indicated by the darkened region, an attenuated phase shift mask material, for example having a nominal transmissivity of 6%, is installed. Example of attenuated phase shift mask material are known to those of skill in the art. See The Attenuated Phase Shift Mask, B. Lin, supra. Other examples of a mechanism for reducing the transmission of a region of the reticle include a dielectric, partially reflecting layer located on the reticle face or backside, as illustrated in FIG. 28. In this embodiment, the reduced transmission mechanism is localized to complementary alignment attribute region of the reticle. In addition, instead of a partially reflecting backside layer, a partially absorbing one could be used. Also, in reflective reticles as shown in FIG. 30, such as used in EUV, a complementary alignment attribute with reduced reflection could be provided.

Returning to FIG. 43, after the reticle has been provided in block 4302, flow continues to block 4304 and a photo resist coated wafer is provided. Flow continues to block 4306. In block 4306, image field blades in the projection imaging system are apertured down on the reticle to an area corresponding to the projected field of the projection imaging tool and the reticle is exposed on the wafer. Flow continues to block 4308.

In block 4308 the image blades are apertured down on the reticle to an area corresponding to the complementary alignment attribute. Because the transmissivity of the portion of the reticle corresponding to the complementary alignment attribute has been reduced the exposure dose required to fully develop the photo resist and create a printed complementary alignment attribute is greater by an amount corresponding to $$\frac{T_{nom}}{TCAA}$$

where TCAA is the transmission of the complementary alignment attribute. Thus, the reference exposure dose (Esub as described in block 4002 in FIG. 40 above) required to expose the printed complementary alignment attribute to a level of Enom is:

$$E_{sub} = E_{nom} * \frac{T_{nom}}{(N * TCAA)} \quad \text{(eq. 30)}$$

Typically, dose $E_{sub}$ is approximately the same as dose E0 and is therefore more readily accessible within the operational framework of the projection imaging tool. For example, if $E_{nom}$=2*E0, $T_{nom}$=0.92, TCAA=0.06, and N=20 exposures then, from Equation 30, $E_{sub}$~1.5E0. This is contrasted with other embodiments which do not utilize a decreased transmission reticle where $E_{sub}$~0.1E0. While this latter exposure dose of about 0.1E0 may be achievable on some projection imaging tools, the former dose of about 1.5E0, which is approximately 15 times greater, will typically be easier to achieve in practice. Another advantage of this technique is the ability to average over a greater number, N, of instances of the reference complementary alignment attribute placement.

Returning to FIG. 43, flow continues to block 4310. In block 4310, the exposed wafer is developed and the overlay targets are read, or measured, in an overlay metrology tool. Flow then continues to block 4312 where the projection imaging tool, or machine, intra-field distortion is reconstructed as described above.

Fourth Exposure Averaging Embodiment

Figure 46:
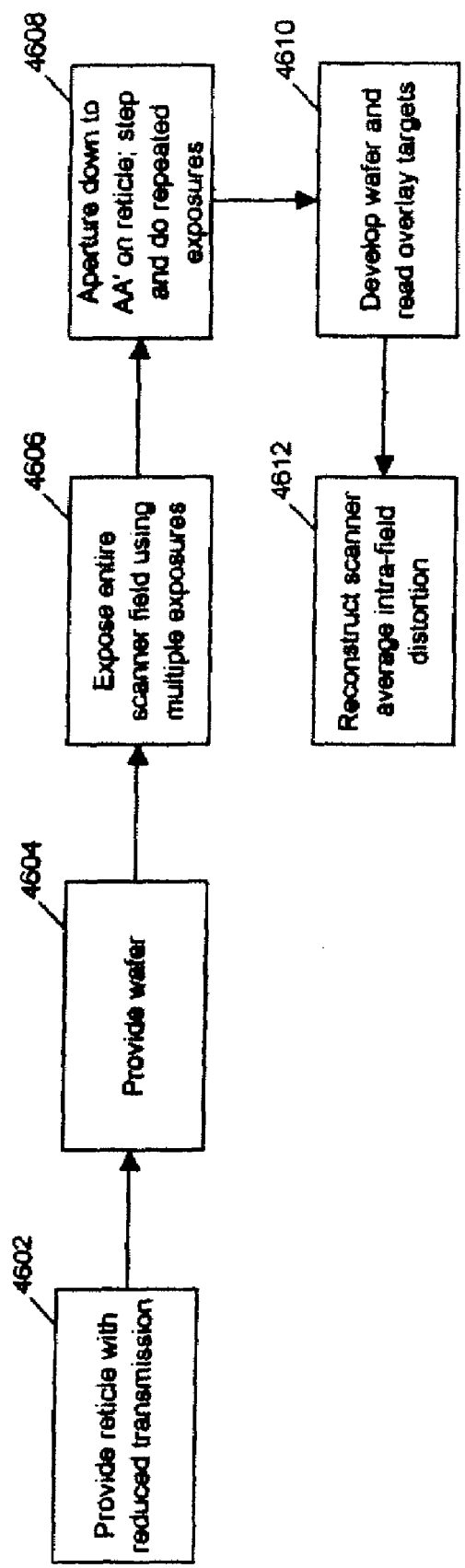
FIG. 46 is a flow chart illustrating another technique for reducing noise in measurements used for determining intra field distortion in a scanner.

FIG. 46 is a flowchart illustrating another technique for reducing noise in measurements used for determining intra field distortion in a scanner. Flow begins in block 4602 where a reticle is provided. In this embodiment, the portion of the reticle corresponding to both the alignment attributes and the complementary alignment attributes are both configured to have reduced transmission. For example, the reduced transmissivity of the alignment attributes and the complementary alignment attributes may be reduced by the same amount, or they may be reduced by different amounts. Also, different mechanisms may be used to reduce the transmission of different portions of the reticle. For example, one mechanism may be used to reduce the transmission of the portion of the reticle corresponding to the alignment attributes, and a different mechanism may be used to reduce the transmission of the portion of the reticle corresponding to the complementary alignment attribute. Likewise, different mechanisms may be used to reduce the transmission of some of the alignment attributes and a different mechanism may be used to reduce the transmission of other alignment attributes on the same reticle. This is desirable when it is wished to have different amounts of averaging (N=5 and N=20 say) for the same $E_{sub}$.

Flow continues to block 4604 where a wafer is provided. Flow then continues to block 4606. In block 4606 multiple dynamic exposures of the scanner field are performed. Multiple exposures of the scanner field helps to reduce the effect of scan synchronization error on measurements. Using the reduced transmission reticle, the per scan dose is generally more accessible within the operational framework of a typical scanner. Flow continues to block 4608.

In block 4608 the image blades are apertured down on the reticle to an area corresponding to the complementary alignment attribute. As described above, for block 3808 in FIG. 38, the transmission of the portion of the reticle corresponding to the complementary alignment attribute has been reduced, causing the exposure dose required to fully develop the photo resist and create a printed complementary alignment attribute to be greater by an amount corresponding to $$\frac{T_{nom}}{TCAA}.$$

Flow continues to block 4610 and the exposed wafer is developed and the overlay targets are read, or measured, in an overlay metrology tool. Flow then continues to block 4612 where the projection imaging tool, or machine, intra-field distortion is reconstructed as described above.

Other Embodiments and Variations

Figure 47:
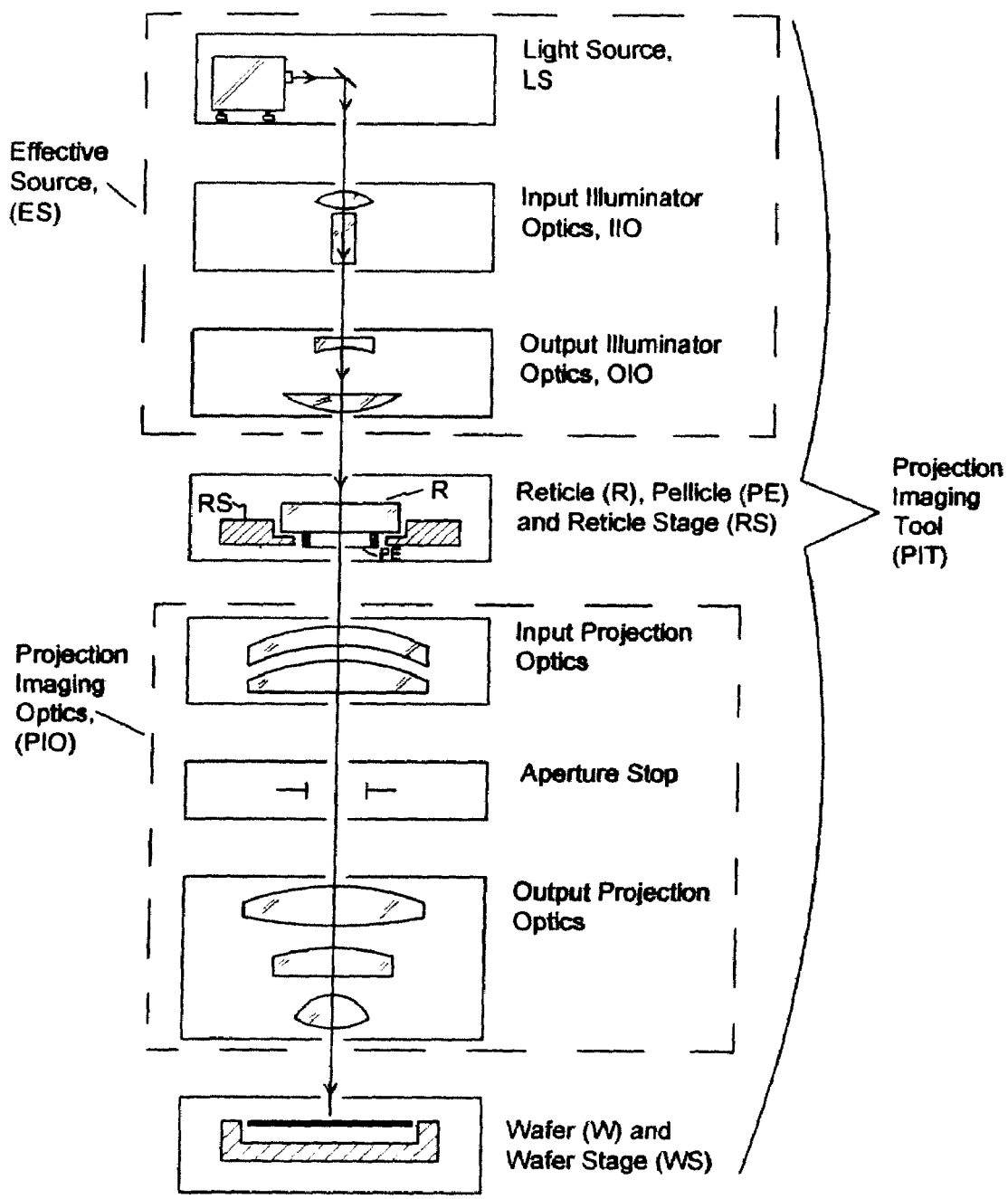
FIG. 47 is a block diagram of an example of a projection imaging tool.

FIG. 47 is a block diagram of an example of a projection imaging tool (PIT). As shown in FIG. 47, the projection imaging tool includes an effective source ES, a reticle stage RS, projection imaging optics PIO, and a wafer stage WS. The effective source ES includes a light source LS, input illuminator optics IIO and output illumination optics OIO.

The reticle stage RS holds a pellicle PE reticle (R) combination. For example, the reticle stage may be used to hold, and position, reticles configured as described in the above embodiments.

The projection imaging optics include input projection optics, an aperture stop, and output projection optics. The wafer stage WS is configured to hold and position a photo resist coated wafer.

Heretofore, it has been considered the reticle creating the overlay patterns as perfect. In practice it is not, but errors in the reticle manufacture can be taken into account by first measuring the position of all the individual structures in all of the overlay groups using an absolute metrology tool such as the Nikon 5I (See Measuring System XY-5i, supra), or Leica LMS 3200 series tools. Next, in formulating Equations 20-23, this reticle error (divided by the photolithographic exposure tool demagnification) is explicitly written out on the right hand side and then subtracted from the resulting overlay measurements on the left hand side of the equations (thereby canceling out on the right hand side). The result is Equations 20-23 as they are written above but with a correction applied to the overlay measurements appearing on the left hand side. The analysis then proceeds word for word as before.

The reticle of the present invention is typically glass or fused silica with openings defined in a chrome coating. This is common for projection lithography tools utilized in semiconductor manufacture. The form the reticle can take will be determined by the format required by the specific projection imaging tool on which the reticle is loaded. Thus for purposes of analyzing copying machine performance, the reticle OL of the present invention would consist of a piece of paper or mylar with overlay groups disposed on it. In an extreme ultra violet (EUV) exposure tool the mask would be reflective.

Figure 3:
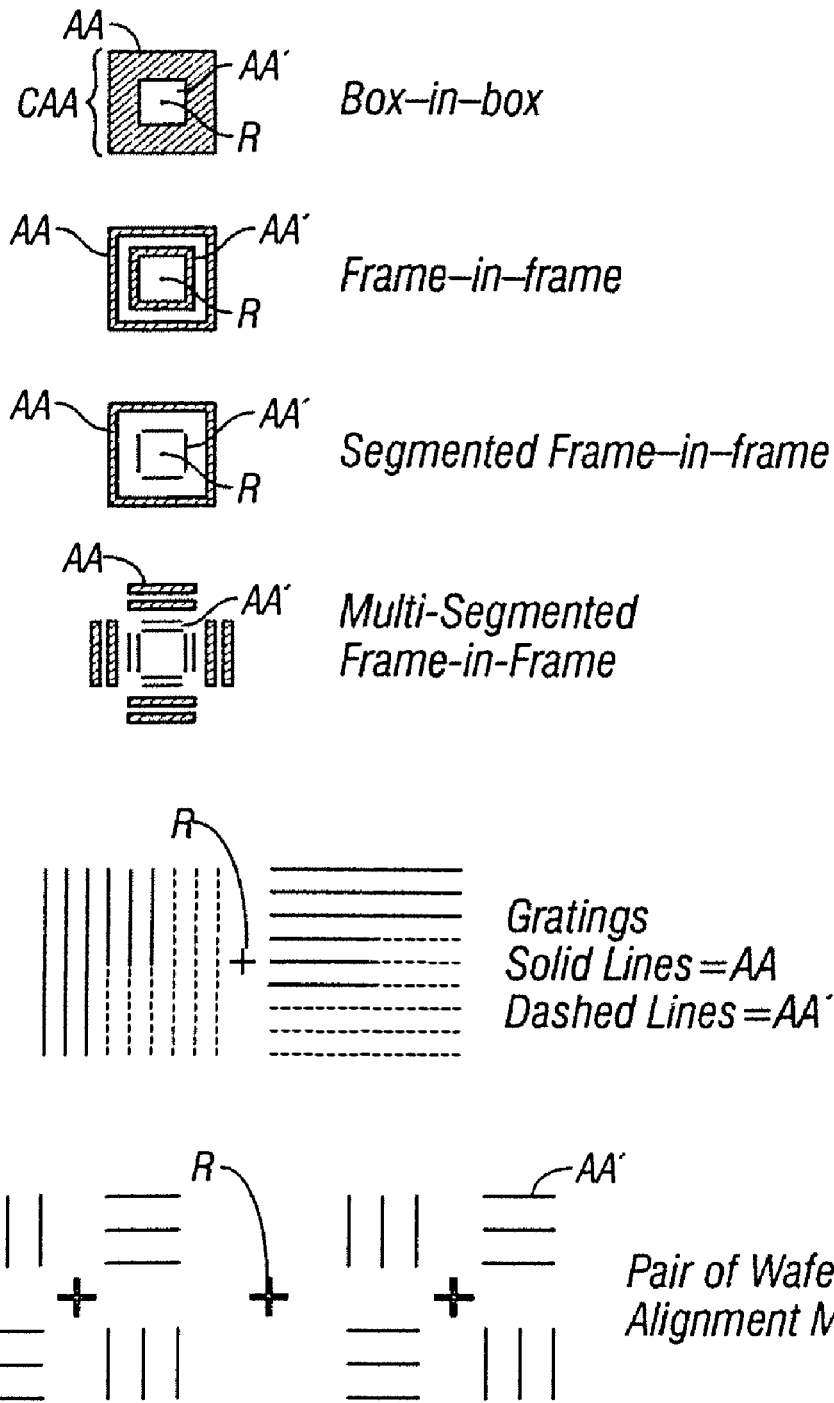
FIG. 3 shows typical overlay patterns or completed alignment attributes.

The completed alignment attributes of the present invention so far discussed are of the box in box, bar in bar, or wafer alignment marks most commonly used in semiconductor manufacture. In practice, hundreds of different overlay target patterns are available (See Handbook of Microlithography and Microfabrication, supra; Direct-Referencing Automatic Two-Points Reticle-to-Wafer Alignment Using a Projection Column Servo System, M. Van den Brink et al., SPIE Vol. 633, Optical Microlithography V, 60:71, 1986; Overlay Alignment Measurement of Wafers, N. Bareket, U.S. Pat. No. 6,079,256, Jun. 27, 2000; FIG. 1), some common completed alignment attributes are shown in FIG. 3. The exact form taken by the completed alignment attributes will be determined by the overlay metrology used in the measurement step.

The overlay metrology tool utilized by the present invention is typically a conventional optical overlay tool such as those manufactured by KLA-Tencor (See KLA 5105 Overlay Brochure, supra; KLA 5200 Overlay Brochure, KLA-Tencor) or Bio-Rad Semiconductor Systems. See Quaestor Q7 Brochure, Bio-rad Semiconductor Systems. Other optical overlay tools that can be used by the present invention include those described in See Process for Measuring Overlay Misregistration During Semiconductor Wafer Fabrication, I. Mazor et al., U.S. Pat. No. 5,438,413, Aug. 1, 1995. In addition, some steppers or scanners (See Matching Management of Multiple Wafer Steppers Using a Stable Standard and a Matching Simulator, supra) can utilize their wafer alignment systems and wafer stages to function as overlay tools. However, in this role we would limit the total size of the alignment attribute (consisting of 2 wafer alignment marks) to a distance over which the wafer stage would be as accurate as a conventional optical overlay tool. This distance is typically less than about 2.0 mm. When electrical alignment attributes are used for overlay (See Matching Management of Multiple Wafer Steppers Using a Stable Standard and a Matching Simulator, supra; Automated Electrical Measurements of Registration Errors in Step and Repeat Optical Lithography Systems, T. Hasan et al., IEEE Transaction on Electron Devices, Vol. ED-27, No. 12, 2304:2312, December 1980; Capacitor Circuit Structure for Determining Overlay Error, K. Tzeng et al., U.S. Pat. No. 6,143,621, Nov. 7, 2000), the overlay metrology tool as utilized by this invention would correspond to the electrical equipment utilized for making the corresponding measurement.

The present invention has been mainly described with respect to its application on the projection imaging tools (scanners (See Micrascan™ III Performance of a Third Generation, Catadioptric Step and Scan Lithographic Tool, D. Cote et al., SPIE Vol. 3051, 806:816, 1997; ArF Step and Scan Exposure System for 0.15 Micron and 0.13 Micron Technology Node, J. Mulkens et al., SPIE Conference on Optical Microlithography XII, 506:521, March 1999; 0.7 NA DUV Step and Scan System for 150 nm Imaging with Improved Overlay, J. V. Schoot, SPIE Vol. 3679, 448:463, 1999) commonly used in semiconductor manufacturing today. The methods of the present invention can be applied to other scanning projection tools such as; 2-dimensional scanners (See Large-Area, High-Throughput, High Resolution Projection Imaging System, Jain, U.S. Pat. No. 5,285,236, Feb. 8, 1994; Optical Lithography—Thirty Years and Three Orders of Magnitude, supra), office copy machines, and next generation lithography (ngl) systems such as XUV (See Development of XUV Projection Lithography at 60-80 nm, B. Newnam et al., SPIE Vol. 1671, 419:436, 1992), SCALPEL, EUV (Extreme Ultra Violet) (See Reduction Imaging at 14 nm Using Multilayer-Coated Optics: Printing of Features Smaller than 0.1 Micron, J. Bjorkholm et al., Journal Vacuum Science and Technology, B 8(6), 1509:1513, November/December 1990), IPL (Ion Projection Lithography), and EPL (electron projection lithography). See Mix-and Match: A Necessary Choice, supra.

The present invention has been mainly described with respect to the recording medium being positive photoresist. The present invention could equally well have used negative photoresist providing we make appropriate adjustment to the overlay groups on the reticle. In general, the recording medium is whatever is typically used on the lithographic projection tool we are measuring. Thus, on an EPL tool, an electron beam photoresist such as PMMA could be utilized as the recording medium.

So far, we have described the substrates on which the recording media is placed as wafers. This will be the case in semiconductor manufacture. The exact form of the substrate will be dictated by the projection lithography tool and its use in a specific manufacturing environment. Thus, in a flat panel manufacturing facility, the substrate on which the photoresist would be placed would be a glass plate or panel. A mask making tool would utilize a reticle as a substrate. Circuit boards or multi-chip module carriers are other possible substrates.

The foregoing description details certain embodiments of the invention. It will be appreciated, however, that no matter how detailed the foregoing appears, the invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes, which come with the meaning and range of equivalency of the claims, are to be embraced within their scope.

I claim:

1. A reticle for use in determining lens distortion in a projection imaging tool, the reticle comprising:
    at least one alignment attribute; and
    a complementary alignment attribute, wherein the transmissivity of the alignment attribute is different than the transmissivity of the complementary alignment attribute.

2. A reticle as defined in claim 1, wherein the transmissivity of the alignment attribute is greater than the transmissivity of the complementary alignment attribute.

3. A reticle as defined in claim 1, wherein, the transmissivity of the alignment attribute is less than the transmissivity of the complementary alignment attribute.

4. A reticle as defined in claim 1, wherein the at least one alignment attributes comprise an array of alignment attributes.

5. A reticle as defined in claim 4, wherein the transmissivity of some of the alignment attributes is different than the transmissivity of others of the alignment attributes.

6. A reticle as defined in claim 1, further comprising phase shift mask material.

7. A reticle as defined in claim 1, further comprising reflective material.

8. A reticle as defined in claim 1, further comprising anti-reflective material.

* * * * *